(12) United States Patent
Halladay et al.

(10) Patent No.: US 11,152,916 B2
(45) Date of Patent: *Oct. 19, 2021

(54) GENERATING A REPRESENTATION OF HIGH-FREQUENCY ELECTRIC POWER DELIVERY SYSTEM DATA USING DEVIATIONS FROM A TREND

(71) Applicant: Schweitzer Engineering Laboratories, Inc., Pullman, WA (US)

(72) Inventors: Matthew J. Halladay, Moscow, ID (US); Eric J. Hewitt, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/871,220

(22) Filed: May 11, 2020

(65) Prior Publication Data
US 2020/0274523 A1  Aug. 27, 2020

Related U.S. Application Data

(63) Continuation-in-part of application No. 15/727,012, filed on Oct. 6, 2017, now Pat. No. 10,664,553.

(51) Int. Cl.
*H03H 17/02* (2006.01)
*G01R 19/25* (2006.01)
(Continued)

(52) U.S. Cl.
CPC ....... *H03H 17/0201* (2013.01); *G01R 13/029* (2013.01); *G01R 19/2513* (2013.01); *G06F 17/18* (2013.01); *H03H 17/0238* (2013.01)

(58) Field of Classification Search
CPC .............. G01R 13/029; G01R 19/2513; G01R 31/088; G06F 17/18; G06Q 50/06; H03H 17/0201; H03H 17/0238
(Continued)

(56) References Cited

U.S. PATENT DOCUMENTS

| 10,664,553 | B2 * | 5/2020 | Hewitt | ................... G06F 17/18 |
| 2002/0008784 | A1 * | 1/2002 | Rata | ........................ H04N 5/20 348/673 |

(Continued)

OTHER PUBLICATIONS

Scichart, Data Resampling | Android Chart Documentation, Scichart, 2011. Retrieved from https://www.scichart.com/documentation/android/current/Data%20Resampling.html Accessed May 13, 2020.

*Primary Examiner* — John H Le
(74) *Attorney, Agent, or Firm* — Richard M. Edge; Zilka-Kotab, PC

(57) ABSTRACT

A system, method, and computer program product are provided for representation of high-frequency signal data. In use, input data is received including high-frequency signals, wherein the input data is of a first width. Next, the input data is processed to manage display of the input data, where specifically the input data is divided into one or more segments based on first criteria including the first width, and from each segment of the one or more segments, a maximum value is identified and a minimum value is identified. The maximum and minimum may be trend maximum and minimum values. The input data is transformed to a visualizable representation of the high-frequency signals, the visualizable representation of the high-frequency signals including a plot of the maximum value and the minimum value for each segment of the one or more segments. Additionally, the plot is displayed.

18 Claims, 20 Drawing Sheets

(51) Int. Cl.
*G06F 17/18* (2006.01)
*G01R 13/02* (2006.01)

(58) Field of Classification Search
USPC .......................................................... 702/59
See application file for complete search history.

(56) References Cited

U.S. PATENT DOCUMENTS

2013/0346419 A1* 12/2013 Hewitt ................ G06F 16/2458
707/746
2014/0207017 A1* 7/2014 Gilmore ................ A61B 5/389
600/546

* cited by examiner

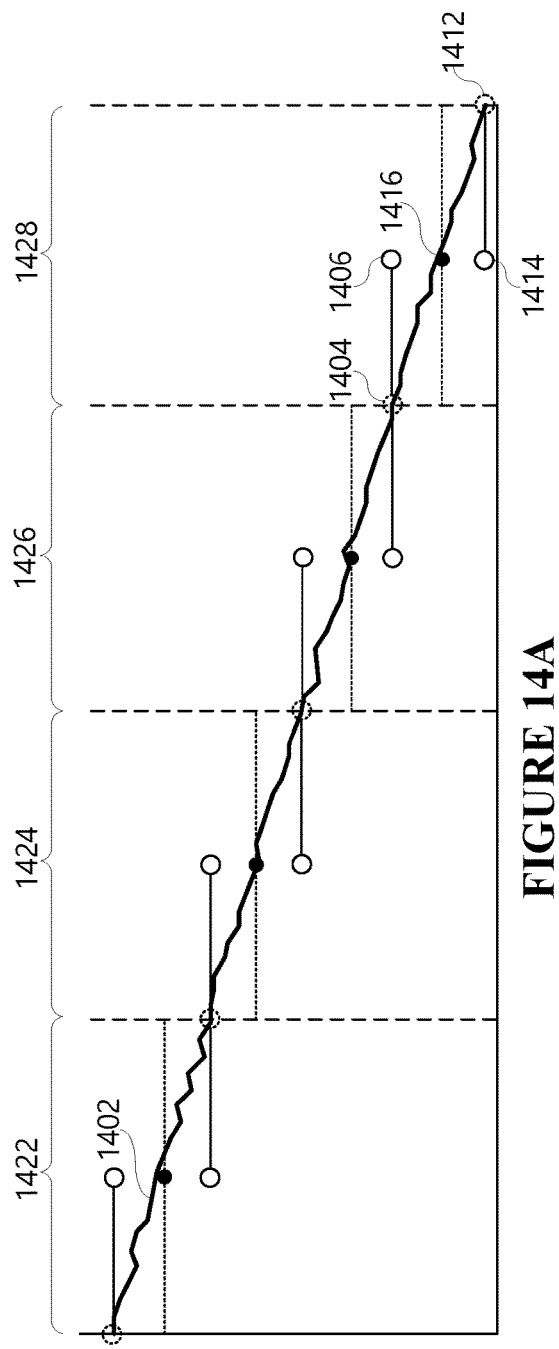
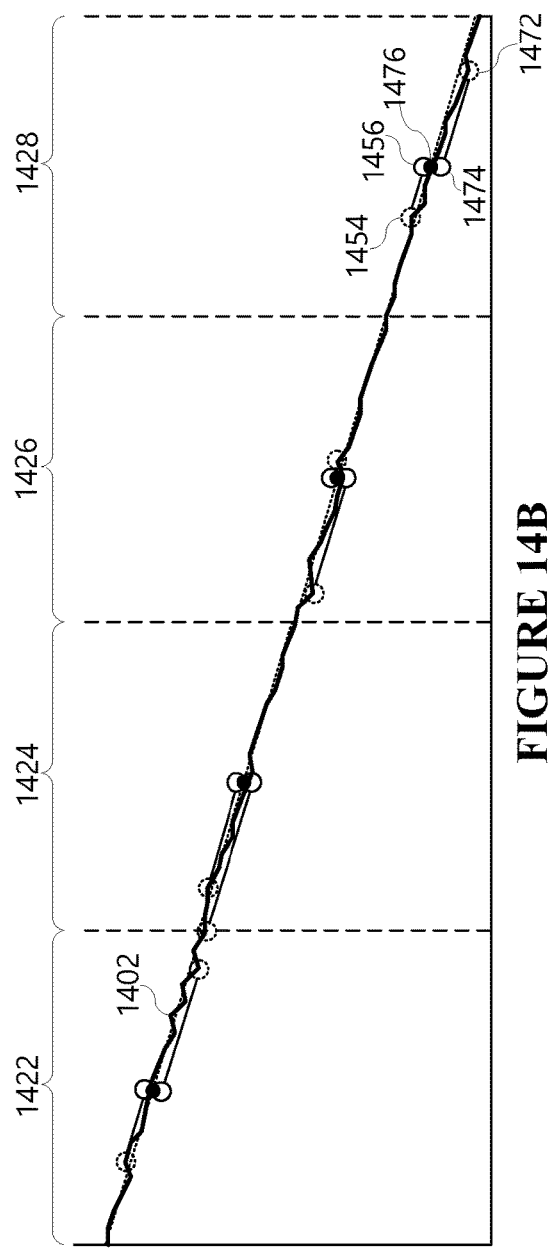
FIGURE 14A
FIGURE 14B

GENERATING A REPRESENTATION OF HIGH-FREQUENCY ELECTRIC POWER DELIVERY SYSTEM DATA USING DEVIATIONS FROM A TREND

PRIORITY APPLICATION

This application claims benefit as a Continuation-in-Part of U.S. Non-Provisional application Ser. No. 15/727,012 filed on 6 Oct. 2017, naming Eric J. Hewitt and Matthew J. Halladay as inventors; which is incorporated by reference herein in its entirety.

FIELD OF THE INVENTION

The present invention relates to presenting signal data, and more particularly to improving the representation of high-frequency signal data.

BACKGROUND

Currently, analytical data gathered from an electrical power distribution system may be used to understand power generation and diagnose potential problems. Often, such analytical data may include high-frequency data. Displaying high-frequency data, however, may pose a variety of issues, including slow processing time, inaccurate representation of the displayed data, etc. Additionally, such issues are often increased as the data is zoomed out. Current methods to rectify such issues include, for example, a filter applied to the analytical data to remove the high frequency. Such an approach, however, fails to allow for analysis of the high-frequency data. A second approach may include rendering the high-frequency data by applying an alias, resulting in the high-frequency data being displayed as a lower-frequency signal. However, this second approach may cause an inaccurate representation of the high-frequency data.

There is thus a need for addressing these and/or other issues associated with the prior art.

BRIEF DESCRIPTION OF THE DRAWINGS

FIGS. 14A and 14B illustrate plots of a power system signal over time with min max values (FIG. 14A) and interpolated min max values (FIG. 14B).

DETAILED DESCRIPTION

Figure 1:
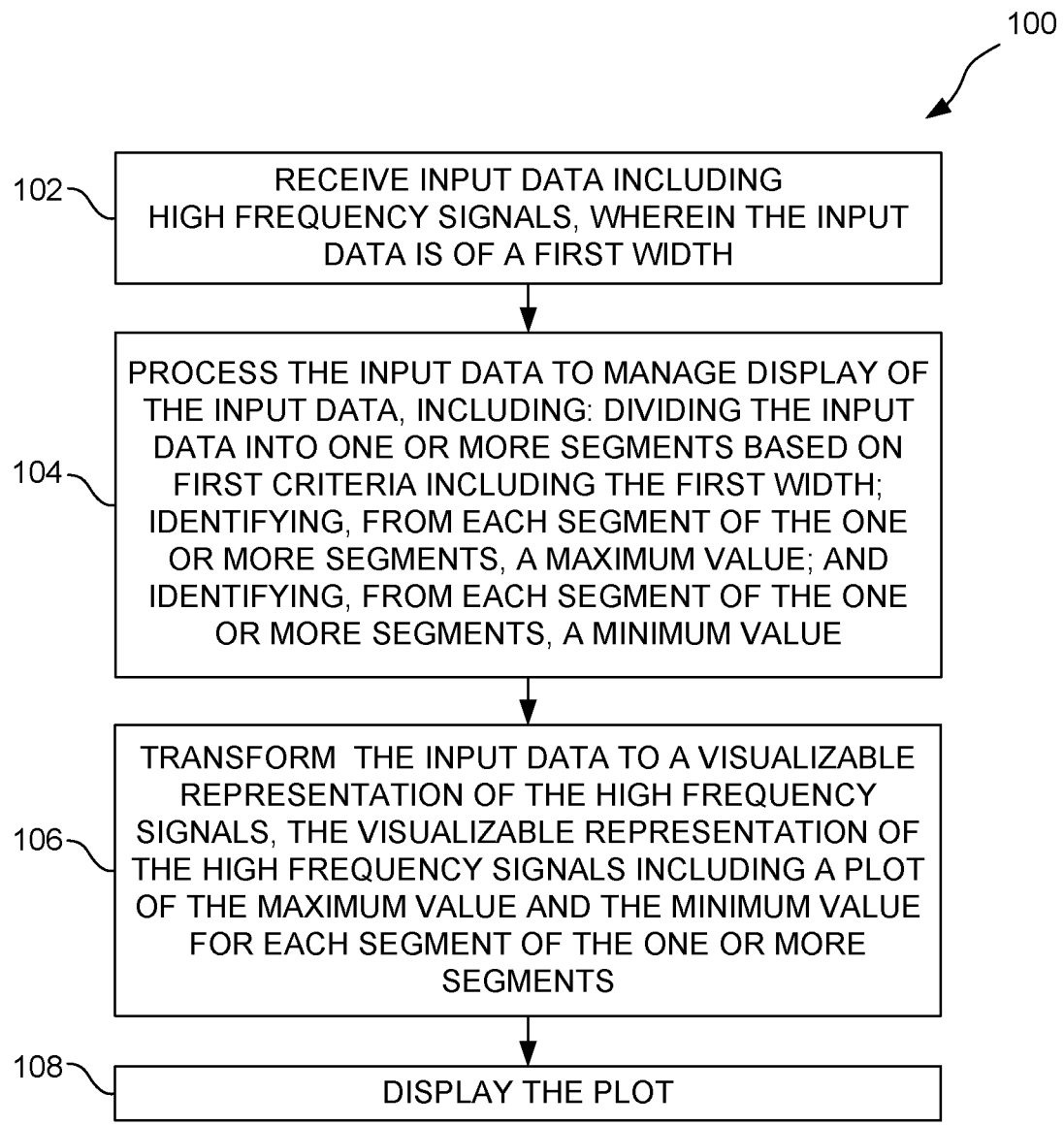
FIG. 1 illustrates a method for generating a representation of high-frequency signal data, in accordance with one embodiment.

FIG. 1 illustrates a method 100 for generating a representation of high-frequency signal data, in accordance with one embodiment. As shown, in operation 102, input data is received including high-frequency signals, wherein the input data is of a first width. In the context of the present description, the aforementioned input data may include any set of signals (including potentially high-frequency signals) generated by a power distribution system. For example, such signals may be generated by faults, partial discharge activity, equipment operation (e.g., breakers operating, capacitor banks switching, voltage tap changes, etc.).

Still yet, in the present description, a high-frequency signal may refer to any frequency considered high based on the context from which the signal is obtained. For example, a high-frequency signal relating to speech may be 3 kHz, whereas a high-frequency signal relating to a wireless transmission may be 5 GHz. Even still, a high-frequency signal relating to electric power systems may be in the range of 1 kHZ.

In the present description, the first width may refer to any measurement from side to side of the signals included in the input data. For example, in one possible embodiment, the width may be what is displayed within a window, or may be based on a size of a window in which the signals are displayed.

The input data is then processed in operation 104 to manage display of the input data, including: dividing the input data into one or more segments based on first criteria including the first width; identifying, from each segment of the one or more segments, a maximum value; and identifying, from each segment of the one or more segments, a minimum value. The first width may be determined based, at least in part, on the first criteria. In various embodiments, the first criteria may include at least one of a pixel resolution of a window, a zoom factor (or a plurality of zoom factors), a width associated with a maximum value, a width associated with a minimum value, or an error factor associated with the input data. Also, in the context of the present description, the first criteria may include the error factor that is an identified signal disturbance. Further, the first criteria may include preset optimal settings with a preconfigured zoom level. Specifically, such optimal settings may include pre-viewing actions and current-viewing actions. Pre-viewing actions may include applying various settings (e.g. zoom level 1, zoom level 2, etc.) to the input data such that results are generated before they are requested or viewed. Current-viewing actions may include applying various settings (e.g. window size X, zoom level Y, minimum value width Z, etc.) to be displayed. In one embodiment, such current-viewing actions may be applied when a user interface (e.g. showing the plot, as will be elaborated upon later in greater detail) is initially requested, or may be applied as manually requested (e.g. based on a default setting or preconfigured setting to be applied as desired, etc.).

Thus, the first criteria may be used to modify a display (used to present the representation of the input data), configure predetermined settings, and/or personalize the interaction with the plot in some manner. In one embodiment, the width of the segment of the one or more segments may be based on one of natural numbers or real numbers. Further, a pre-identification of a pre-maximum value and a pre-minimum value may be identified for use with the first criteria.

In the context of the present description, the one or more segments may include any grouping of the input data. For example, the input data (i.e. signals) may be divided into a number of bins (e.g. frequency bins) equal to the width of an output (e.g. minimum value or maximum value). In one embodiment, the width of a segment of the one or more segments may be equal to or less than the first width of the input data.

In the context of the present description, the maximum value may correspond with a maximum point of a segment of the input data (e.g. frequency signal) and the minimum value may correspond with a minimum point of a segment of the input data (e.g. frequency signal). In one embodiment, the first criteria may include a width of a segment of the one or more segments, wherein the width of the segment is based on a time interval associated with the maximum value or the minimum value. Also, in the context of the present description, each of the maximum value and the minimum value may be recorded as a vector. Further, the input data may be filtered prior to identifying the maximum value or the minimum value.

In one embodiment, receiving the input data may include receiving a maximum value input and a minimum value input, where the maximum value input may be used to identify the maximum value, and the minimum value input may be used to identify the minimum value. As an option, a width of the maximum value input may differ from a width of the maximum value, and a width of the minimum value input may differ from a width of the minimum value.

With continuing reference to FIG. 1, in operation 106, the input data is transformed to a visualizable representation of the high-frequency signals, the visualizable representation of the high-frequency signals including a plot of the maximum value and the minimum value for each segment of the one or more segments. In the context of the present description, transforming the input data to a visualizable representation may include receiving the raw input data, extracting points of interest (e.g. maximum value, minimum value, etc.) and then constructing a representation of the input data based on such points of interest. In this manner, only a fraction of the raw input data (in the form of the maximum value and the minimum value) may be used to construct the representation.

To this end, in operation 108, a plot may be displayed. In one embodiment, the plot may include a shaded region between the maximum value and the minimum value for each segment of the one or more segments. Additionally, an overlay may be displayed over the plot. For example, the overlay may include one of a median value of each segment of the one or more segments or a filtered sampled value, the overlay being displayed in a different color than a color of the shaded region.

The plot may present the identified signal disturbance. Of course, it is appreciated that any signal deviation or anomaly may be additionally displayed.

Still yet, the plot may be saved. To this end, the saved plot may require less data (in comparison to the input data) and may preserve raw data (e.g. maximum value, minimum value, etc.) of the input data. Additionally, the plot may be saved with raw data based on the input data, wherein the raw data may include, at a minimum, the maximum value and the minimum value. Further, the plot may be sent to a downstream device in an efficient manner (via reduced data for transmission and display).

Figure 2:
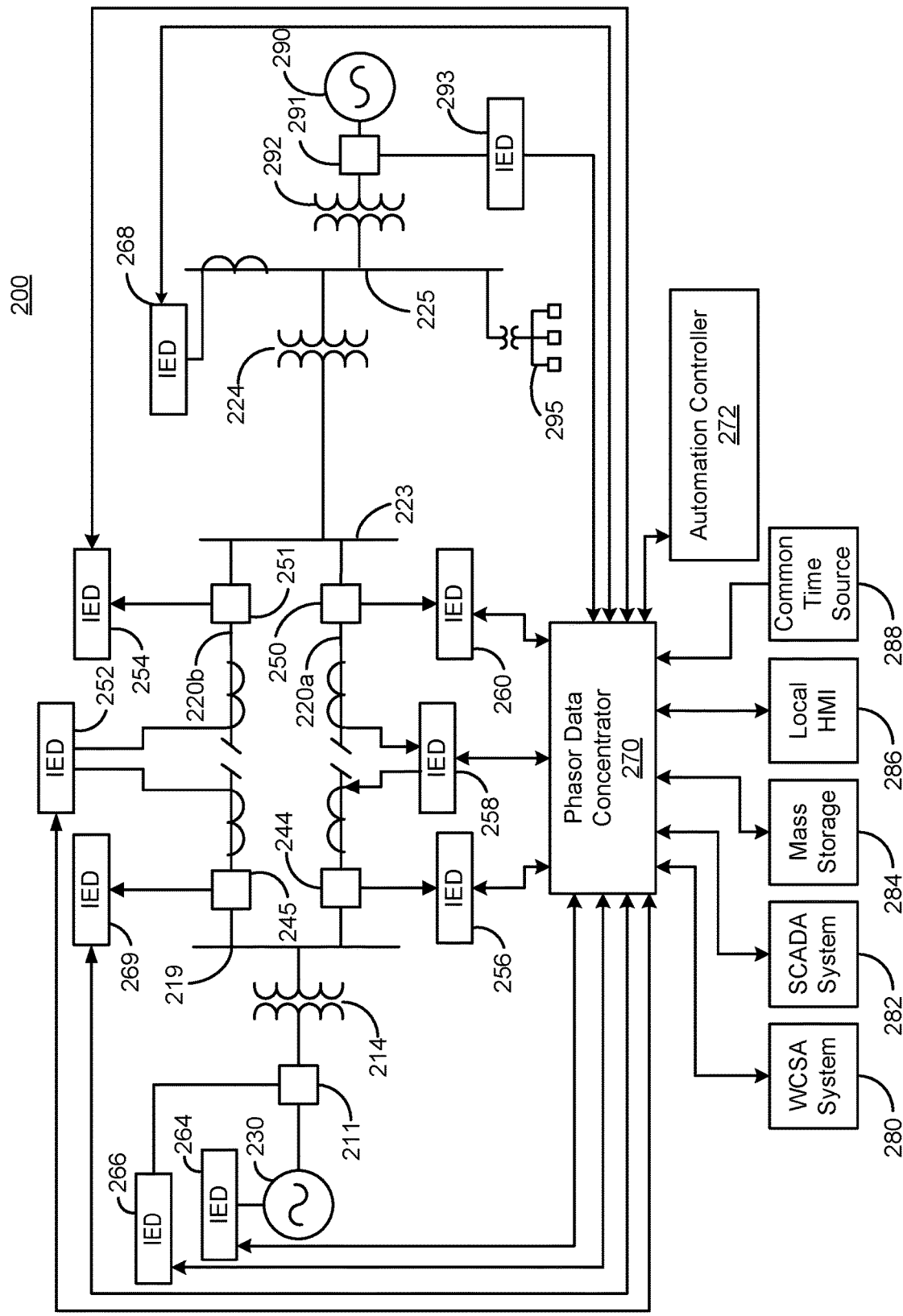
FIG. 2 illustrates a diagram of an electric power delivery system, in accordance with one embodiment.

FIG. 2 illustrates a diagram of an electric power delivery system 200, in accordance with one embodiment. As an option, the system 200 may be implemented in the context of any one or more of the embodiments set forth in any previous and/or subsequent figure(s) and/or description thereof. However, it is to be appreciated that the system 200 may be implemented in the context of any desired environment. In particular, the system 200 may provide one example where high-frequency signal data may be obtained, as described in relation to method 100.

As shown, system 200 includes a simplified example of an electric power delivery system. Such a system 200 may include generator 230 which may be monitored by an intelligent electronic device (IED) (e.g. IED 164), and may generate electric power. Generator 230 may be connected to bus 219 via a circuit breaker 211, which may be controlled using IED 266, and via transformer 214 (which may be a step-up transformer for transforming the voltage of the electric power from generator 230 to a higher voltage suitable for an electric power transmission system).

Bus 219 and bus 223 may be connected via transmission lines 220a and 220b operating at transmission-level voltages. Transmission line 220b may include circuit breakers 245 and 251 monitored and controlled by IEDs 269 and 254. Transmission line 220a may include circuit breakers 244 and 250 monitored and controlled by IEDs 256 and 260. Transmission line 220b may be monitored by an IED 252 which may be capable of providing differential protection. Similarly, transmission line 220a may be monitored and controlled by IED 258 which may be capable of providing differential protection. Alternatively, transmission lines 220a and 220b may be monitored and/or controlled using multiple IEDs such as one IED at each end of the transmission lines capable of performing differential protection using communication therebetween.

Bus 223 may be connected to a distribution bus 225 using a step-down transformer 224 that may be capable of stepping down the voltage from the transmission bus 223 to distribution levels. Bus 225 may be monitored and/or controlled using IED 268, and may provide electric power to load 295 (where the voltage may be stepped further down using a transformer). A further transformer 292 and circuit breaker 291 may connect transmission bus 225 to generator 290. Circuit breaker 291 may be monitored and controlled via IED 293. Generator 290 may be a distributed generator such as a solar-power generator, wind turbine, natural gas electric generator, diesel generator, or the like.

Although not separately illustrated, the various IEDs may obtain electric power information from the monitored equipment in system 200 using potential transformers (PTs, for voltage measurements), current transformers (CTs, for current measurements), etc. The PTs and CTs may include any device capable of providing outputs that can be used by the IEDs to make potential and current measurements, and may include traditional PTs and CTs, optical PTs and CTs, Rogowski coils, hall-effect sensors, etc. Furthermore, although not separately illustrated, each IED may include access to a common time source. The common time source may be distributed via a communications network (using, for example, IEEE-1588 protocol, NTP protocol, or the like), or obtained locally at each IED. The common time source may be a universal time, such as that delivered using global positioning system (GPS) satellites, WWVB, WWV, etc. A common time may be used to time-synchronize measurements of the electric power system, and in the calculation of synchrophasors. Measurements may be paired with a time stamp or time tag indicating a time at which the measurement was made. Accordingly, phasors calculated by the IEDs may include a time stamp indicating a time at which the measurement was made.

IEDs in system 200 may be configured to communicate phasor and/or synchrophasor information to a central unit such as Phasor Data Concentrator (PDC) 270. The PDC 270 may be capable of receiving and storing the phasor and/or synchrophasor or other gathered or calculated power system information (hereinafter "PMU data"). The PDC 270 may be in communication with a mass storage device 284 capable of storing the PMU data received by PDC 270.

PDC 270 may also be in communication with a number of other devices or systems that may consume PMU data. Such devices or systems may include, for example, a Wide Area Control and Situational Awareness (WCSA) System 280, Supervisory Control and Data Acquisition (SCADA) System 282, local Human-Machine Interface (HMI) 286, or automation controller 272. PDC 270 may further include a time input, which may receive a time signal from a common time source 288.

In relation to method 100 specifically, one or more elements in system 200 may be used a basis for input data (e.g. signal data). For example, one or more IEDs (e.g. 252, 254, 256, 258, 260, 264, 266, 268, 269, 293, etc.) may be used to collect or gather information relating to signal data of the power distribution system. Such IEDs may collect the signal data from any component (e.g. conductor, transformer, converter, bus, etc.) of the power distribution system. Additionally, in one embodiment, a database associated with the one or more IEDs may be physically separated or located remotely from the one or more IEDs.

More illustrative information will now be set forth regarding various optional architectures and uses in which the foregoing method may or may not be implemented, per the desires of the user. It should be strongly noted that the following information is set forth for illustrative purposes and should not be construed as limiting in any manner. Any of the following features may be optionally incorporated with or without the exclusion of other features described.

Figure 3:
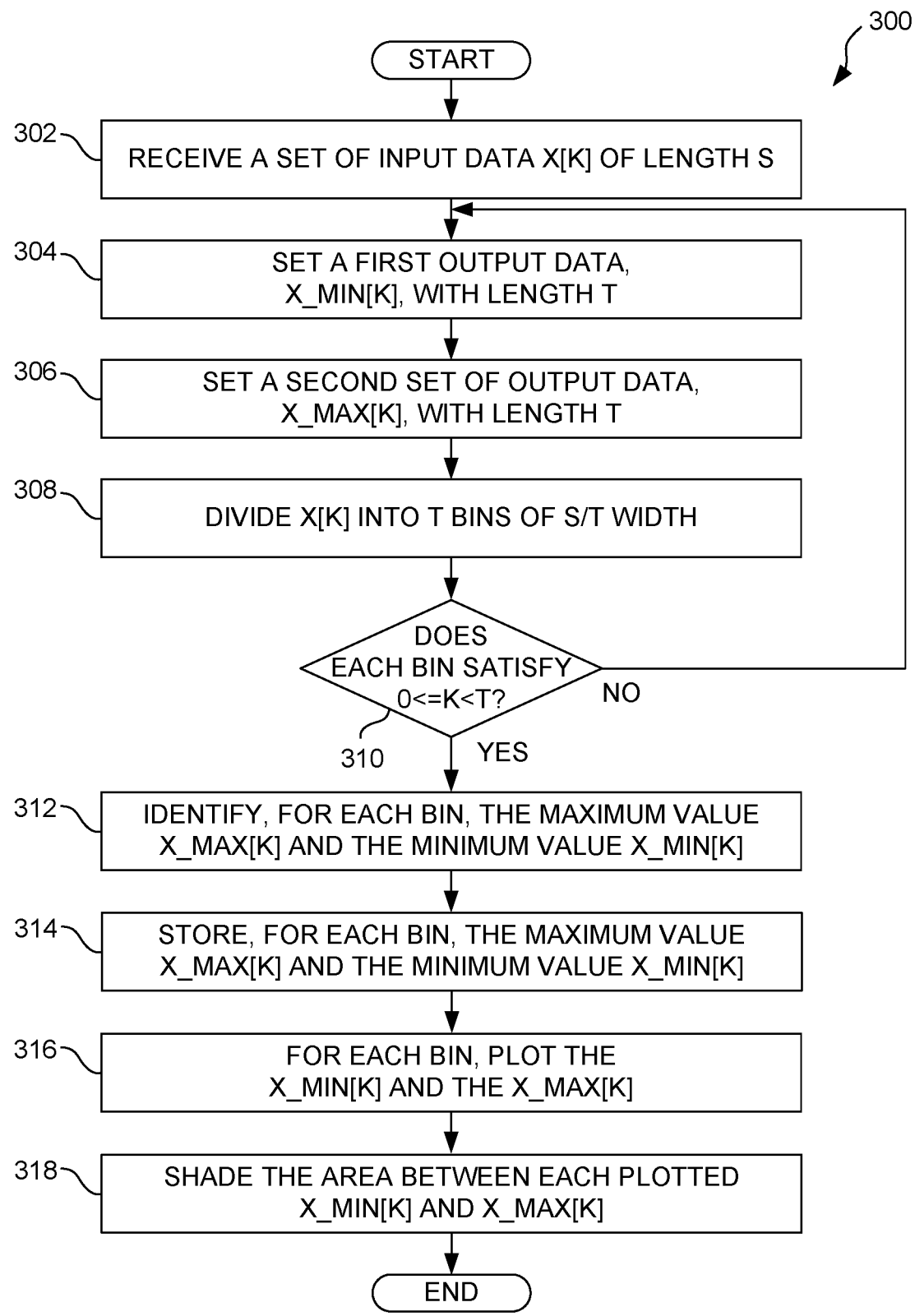
FIG. 3 illustrates a method for generating a representation of high-frequency signal data, in accordance with one embodiment.

FIG. 3 illustrates a method 300 for generating a representation of high-frequency signal data, in accordance with one embodiment. As an option, the method 300 may be implemented in the context of any one or more of the embodiments set forth in any previous and/or subsequent figure(s) and/or description thereof. Of course, however, the method 300 may be implemented in the context of any desired environment. Further, the aforementioned definitions may equally apply to the description below.

In one embodiment, method 300 may represent one exemplary embodiment for generating a representation of high-frequency signal data. In particular, method 300 may represent one exemplary algorithm used to generate a representation of high-frequency signal data. As shown, in operation 302, a set of input data x[k] of length S is received. In one embodiment, the length S may correspond with the first width (see operation 102). Next, in operations 304 and 306, two sets of output data are defined, where operation 304 sets a first output data as x_min[k] with length T, and operation 306 sets a second output data as x_max[k] with length T. In method 300, operations 302, 304, and 306 may represent inference rules (i.e. given clauses, etc.) used in the algorithm for visualizing high-frequency signal data.

Per operation 308, input data x[k] is divided into T bins of S/T width. In the context of the present description, a bin may include a segment of a grouping of the input data. In one embodiment, the number of bins may equal the length of each output (e.g. x_min[k], x_max[k], etc.). To that end, per decision 310, it is determined whether each bin of the T bins satisfies 0<=K<T. In one embodiment, T may be the width of a minimum value or maximum value. Further, a quantity of samples in each bin of a plurality of bins may equal the first width divided by a number of the one or more bins. For example, if length S was 24, and length T was 8, that would correspond with each bin having three (3) items (i.e. T bins of S/T width). Thus, in one embodiment, if a bin includes three (3) items, then one item would be selected from the bin for x_min[k], another one item would be selected from the bin for x_max[k], and the remaining one item would not be used. While the subject matter is being described in the foregoing context, it is not meant to be limiting as those of skill in the art will appreciate that various of the acts and operations (including different sizes of length S and length T) described hereinafter may also be implemented. Still yet, length S may be greater or equal to length T, and the result for T bins may include T items in each output (e.g. per T bins of S/T width).

Additionally, in the context of the present description, when downsampling data, T may represent the amount of underlying raw data that is available for a given requested range, and S may represent the number of data points that will be used to represent the underlying data to the user or application. As an example, time series data may be sampled at 20 thousand points per second, and a user or application may request 13 seconds worth of data to be represented with 500 samples. In such an example, T may equal 20000× 13=160000 (underlying raw data), and S may equal 500 (number of data points). Each bin may be 320 samples wide and may result in a single Min and single Max per bin. In one embodiment, each bin may contain (but is not required to contain) an integer number of points.

If decision 310 results in a "no", the method returns to operation 304. Conversely, if decision 310 results in a "yes", the method proceeds on to operation 312 where, for each bin, the maximum value x_max[k] and the minimum value x_min[k] are identified. In one embodiment, the x_max[k] and x_min[k] may be calculated (see further discussion below relating to FIG. 10A). Additionally, the x[k] data may be filtered prior to calculating the x_min[k] and x_max[k]. For each bin, per operation 314, the maximum value x_max [k] and the minimum value x_min[k] are stored. For example, the maximum value x_max[k] and the minimum value x_min[k] may be stored in a database attached directly to an IED (or other device collecting signal data). In an alternative arrangement, the database may be physically separated or located remotely (e.g. via the cloud). Additionally, each of the maximum value x_max[k] and the minimum value x_min[k] may be stored without time limitations (without end), or with a predetermined time constraint (e.g. 30 days, etc.).

Still yet, per operation 316, for each bin, the x_min[k] and the x_max[k] are plotted. In one embodiment, multiple plots may be displayed simultaneously (i.e. if more than one bin is plotted on a single chart, several x_min[k] points and several x_max[k] points may be plotted). Additionally, where multiple plots are displayed, each bin may operate independent of any of the other displayed bins. For example, if input data associated with a first displayed bin is updated, the plot associated with the first displayed bin may be updated as well, wherein such updates are independent of any other displayed bins.

Lastly, the area between each plotted x_min[k] and x_max [k] is shaded per operation 318. In one embodiment, the shading may be of the same color as the plotted x_min[k] value and the plotted x_max[k] value. Conversely, the shading may be of a different color or pattern from the plotted x_min[k] value and the plotted x_max[k] value.

In this manner, input signal data may be downsampled by computing a minimum and maximum value for each downsample window, and a chart may be constructed showing the minimum value plot and the maximum value plot.

Figure 4A:
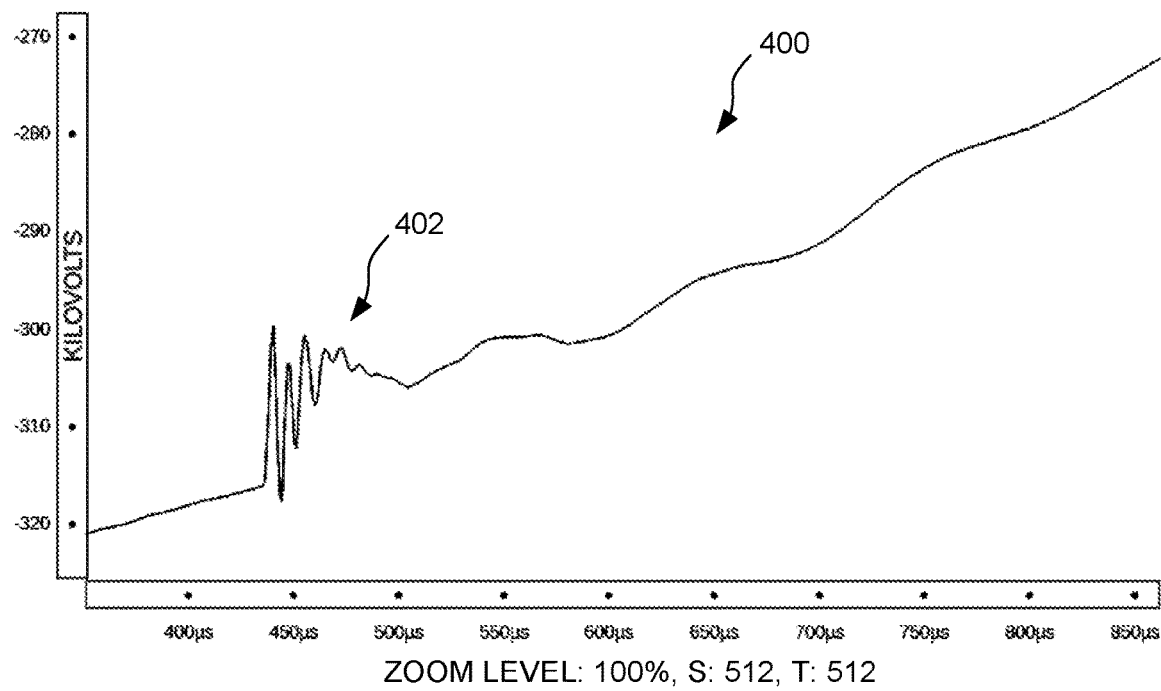
FIG. 4A illustrates a plot showing exemplary data with an unfiltered 60 Hz fundamental signal at zoom level 100%, S value of 512, and T value of 512, in accordance with one embodiment.

FIG. 4A illustrates a plot 400 showing exemplary data with an unfiltered 60 Hz fundamental signal at zoom level 100%, S value of 512, and T value of 512, in accordance with one embodiment. As an option, the plot 400 may be implemented in the context of any one or more of the embodiments set forth in any previous and/or subsequent figure(s) and/or description thereof. However, it is to be appreciated that the plot 400 may be implemented in the context of any desired environment.

As shown in plot 400, at zoom level 100%, a disturbance 402 may be readily observed. Note that the disturbance 402 corresponds with high-frequency data. Additionally, at a zoom level of 100%, note that no shading occurs because all of the displayed data points correspond with all of the raw input data. This is verified by a S value of 512, and a T value of 512, which would correspond with only 1 bin. As such, because a maximum value and a minimum value have not been determined (based on the values of S and T), shading between a maximum value and a minimum value is not found.

Figure 4B:
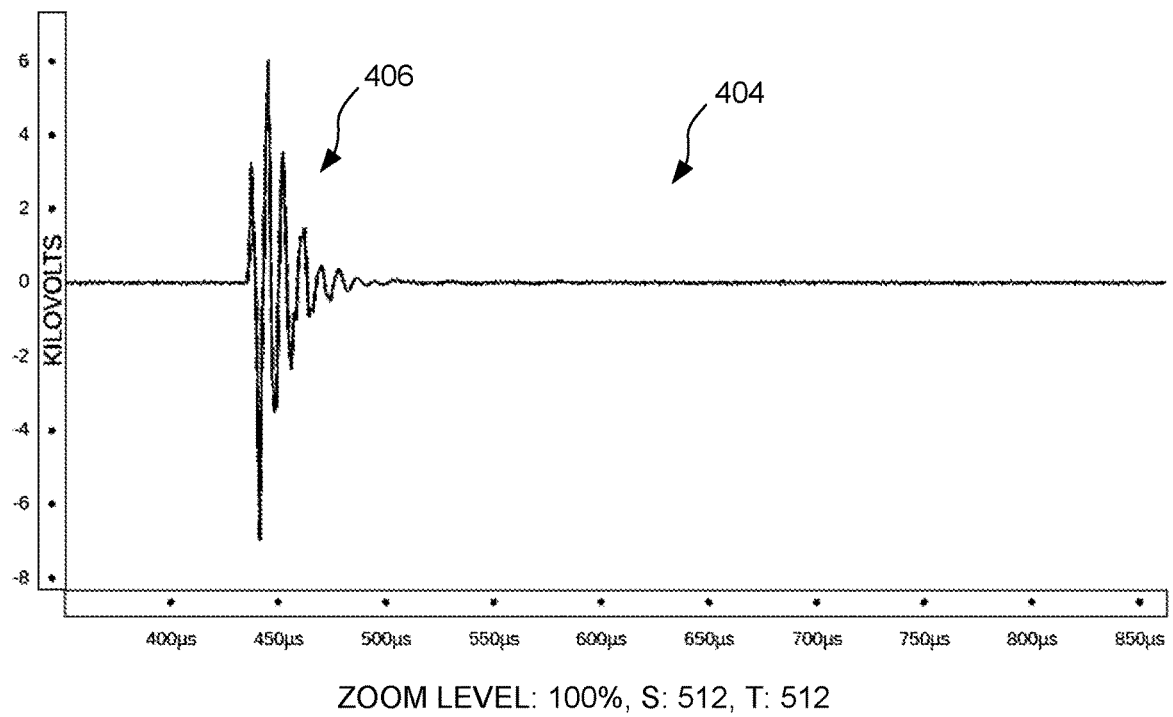
FIG. 4B illustrates a plot showing exemplary data with a high-pass filtered 60 Hz fundamental signal at zoom level 100%, S value of 512, and T value of 512, in accordance with one embodiment.

FIG. 4B illustrates a plot 404 showing exemplary data with a high-pass filtered 60 Hz fundamental signal at zoom level 100%, S value of 512, and T value of 512, in accordance with one embodiment. As an option, the plot 404 may be implemented in the context of any one or more of the embodiments set forth in any previous and/or subsequent figure(s) and/or description thereof. However, it is to be appreciated that the plot 404 may be implemented in the context of any desired environment.

Similar to plot 400, plot 404 is shown at zoom level 100% but, in comparison to plot 400 which showed an unfiltered signal, plot 404 shows a high-pass filtered signal. Note that the disturbance 406 correspond with high-frequency data. Additionally, as described hereinabove in relation to plot 400, no shading is shown for plot 404 because all of the displayed data points correspond with all of the raw input data.

Figure 5A:
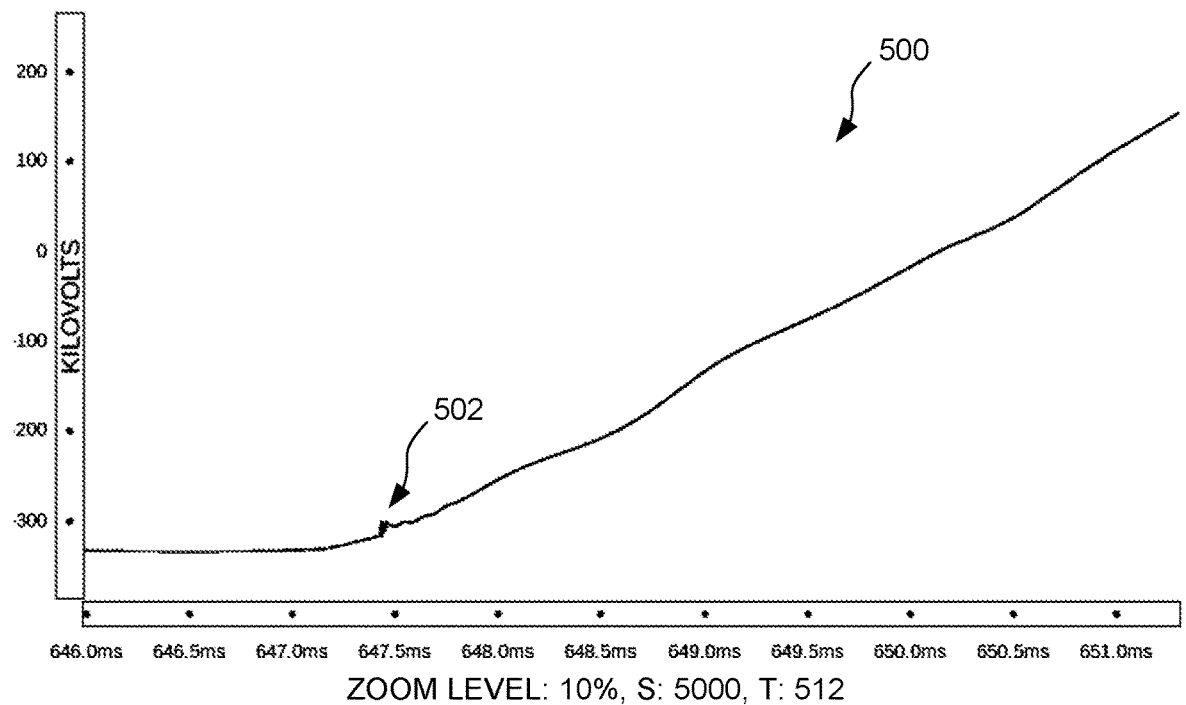
FIG. 5A illustrates a plot showing exemplary data with an unfiltered 60 Hz fundamental signal at zoom level 10%, S value of 5000, and T value of 512, in accordance with one embodiment.

FIG. 5A illustrates a plot 500 showing exemplary data with an unfiltered 60 Hz fundamental signal at zoom level 10%, S value of 5000, and T value of 512, in accordance with one embodiment. As an option, the plot 500 may be implemented in the context of any one or more of the embodiments set forth in any previous and/or subsequent figure(s) and/or description thereof. However, it is to be appreciated that the plot 500 may be implemented in the context of any desired environment.

As shown in plot 500, at zoom level 10%, a disturbance 502 may be readily observed. Note that the disturbance 502 corresponds with high-frequency data. Additionally, at a zoom level of 10%, the input data is separated into bins, a maximum value is identified, a minimum value is identified, and shading between the maximum value and the minimum value is also shown.

Figure 5B:
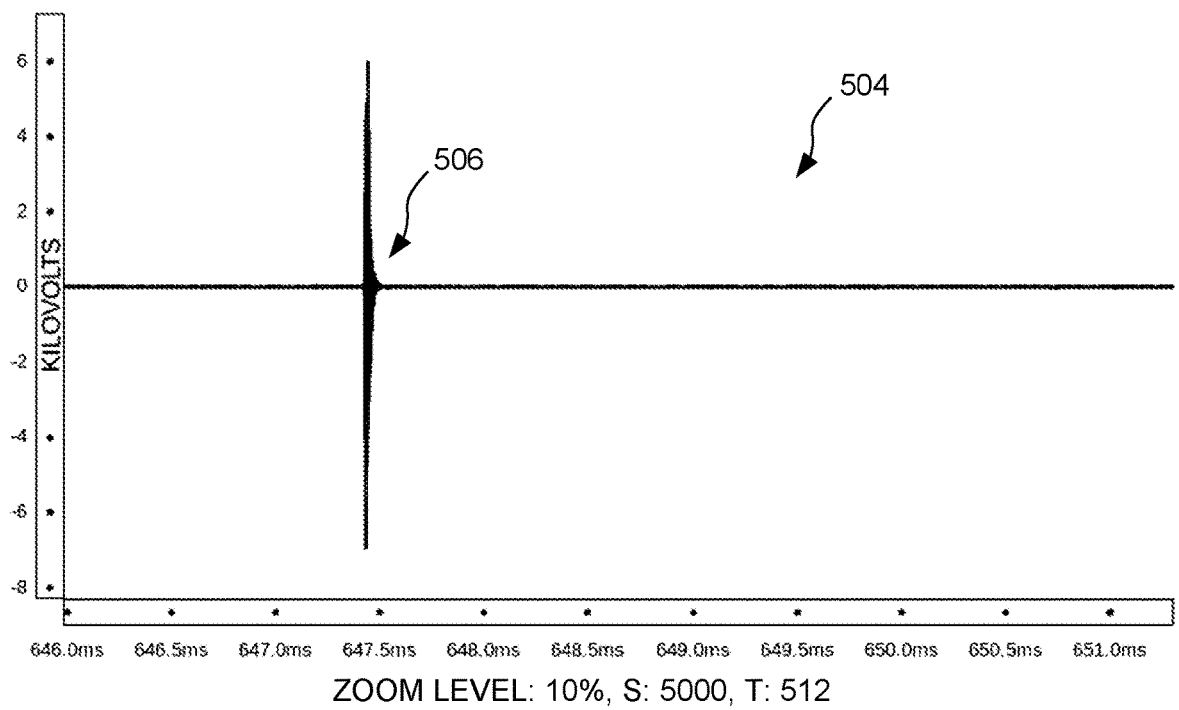
FIG. 5B illustrates a plot showing exemplary data with a high-pass filtered 60 Hz fundamental signal at zoom level 10%, S value of 5000, and T value of 512, in accordance with one embodiment.

FIG. 5B illustrates a plot 504 showing exemplary data with a high-pass filtered 60 Hz fundamental signal at zoom level 10%, S value of 5000, and T value of 512, in accordance with one embodiment. As an option, the plot 504 may be implemented in the context of any one or more of the embodiments set forth in any previous and/or subsequent figure(s) and/or description thereof. However, it is to be appreciated that the plot 504 may be implemented in the context of any desired environment.

Similar to plot 500, plot 504 is shown at zoom level 10% but, in comparison to plot 500 which showed an unfiltered signal, plot 504 shows a high-pass filtered signal. Note that the disturbance 506 correspond with high-frequency data. Additionally, as described hereinabove in relation to plot 500, shading is shown (and in fact more easily observed than in plot 500) between the identified maximum value and the identified minimum value.

Figure 6A:
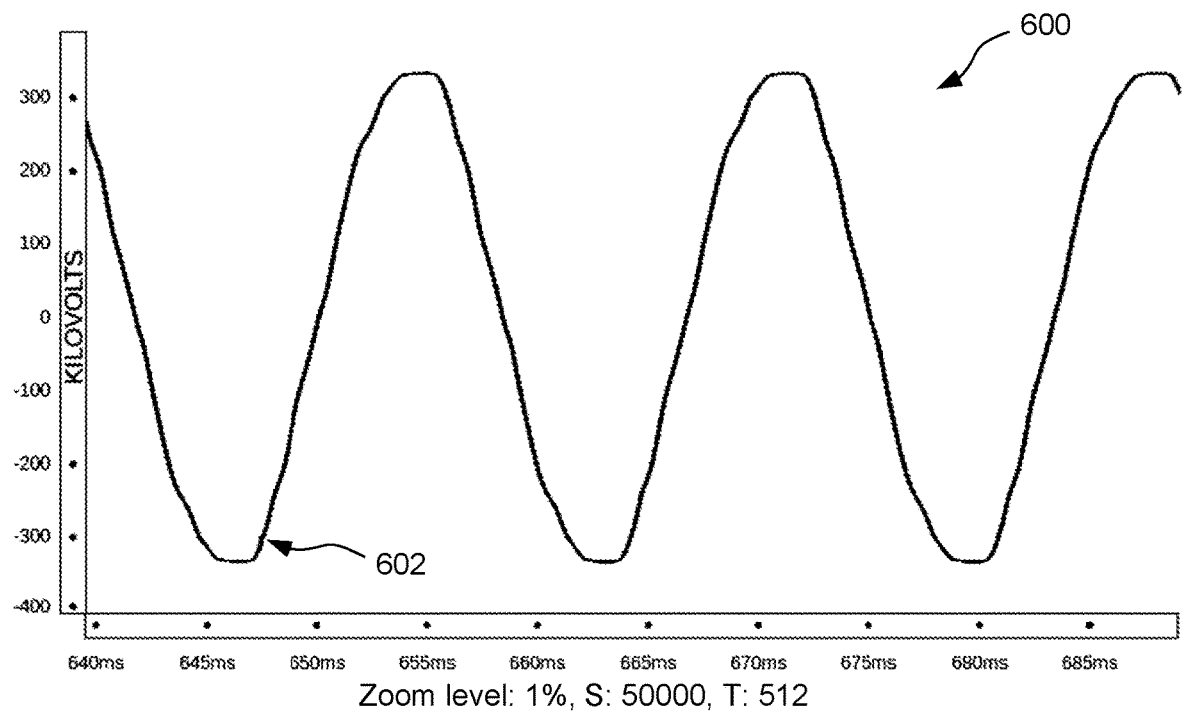
FIG. 6A illustrates a plot showing exemplary data with an unfiltered 60 Hz fundamental signal at zoom level 1%, S value of 50000, and T value of 512, in accordance with one embodiment.

FIG. 6A illustrates a plot 600 showing exemplary data with an unfiltered 60 Hz fundamental signal at zoom level 1%, S value of 50000, and T value of 512, in accordance with one embodiment. As an option, the plot 600 may be implemented in the context of any one or more of the embodiments set forth in any previous and/or subsequent figure(s) and/or description thereof. However, it is to be appreciated that the plot 600 may be implemented in the context of any desired environment.

As shown in plot 600, at zoom level 1%, a slight disturbance 602 may be observed. Such disturbance 602 is not readily or easily observed for the unfiltered fundamental signal. However, plot 604 (described below) more easily displays the disturbance.

As an example, disturbances may be more visible in plot 604 (a min max downsampled chart) because of a time dilation of the min max data. In other words, a point of disturbance may be maintained during downsampling, but if the point of disturbance lasts for only 10 samples, and the data is downsampled by a factor of 1000, then the smallest temporal change that can be represented may be that of 1000 samples.

Further, as a second illustration, disturbances may be more visible in plot 604 (a min max downsampled chart) due to downsampling methods. For example, a low pass filter may be first applied to the data prior to decimation, and such low pass filter may remove any high-frequency changes and lessen step changes (which may be broad frequency). If filtering is first applied (e.g. to isolate high-frequency changes), then the largest changes may be preserved by Min Max downsampling.

Figure 6B:
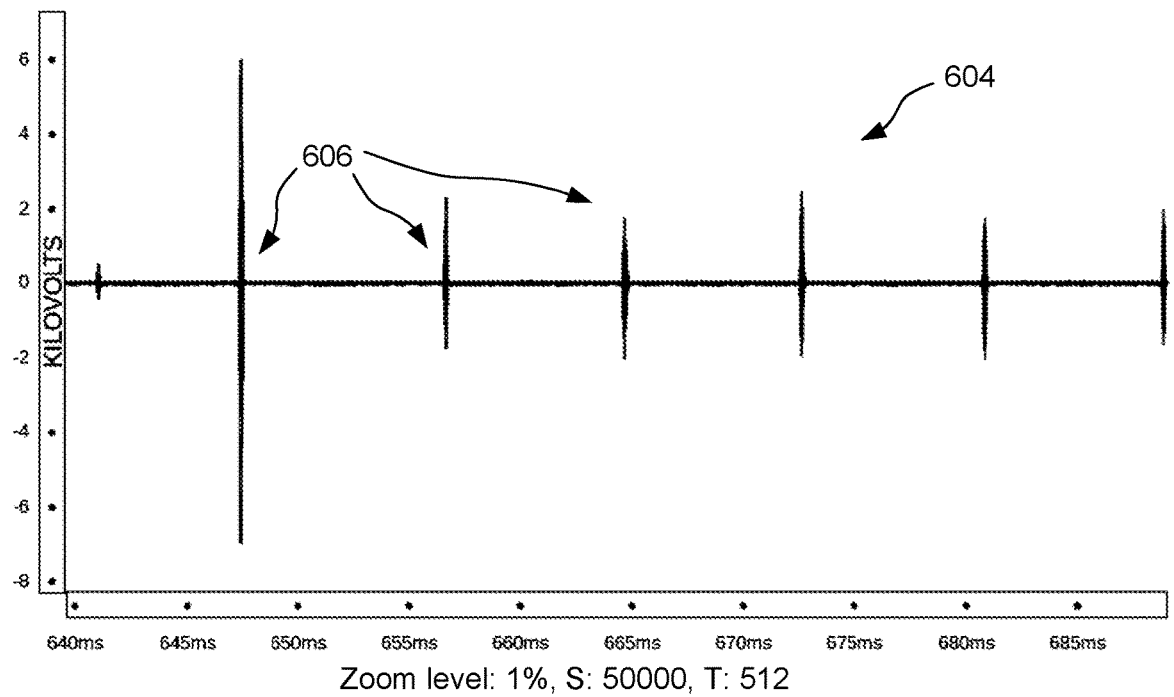
FIG. 6B illustrates a plot showing exemplary data with a high-pass filtered 60 Hz fundamental signal at zoom level 1%, S value of 50000, and T value of 512, in accordance with one embodiment.

FIG. 6B illustrates a plot 604 showing exemplary data with a high-pass filtered 60 Hz fundamental signal at zoom level 1%, S value of 50000, and T value of 512, in accordance with one embodiment. As an option, the plot 604 may be implemented in the context of any one or more of the embodiments set forth in any previous and/or subsequent figure(s) and/or description thereof. However, it is to be appreciated that the plot 604 may be implemented in the context of any desired environment.

Similar to plot 600, plot 604 is shown at zoom level 1% but, in comparison to plot 600 which showed an unfiltered signal, plot 604 shows a high-pass filtered signal. Note that the disturbances 606 correspond with high-frequency data. Each disturbance of disturbances 606 may represent activity at the top and bottom of voltage waveforms. Additionally, such disturbances 606 are more readily and easily observed, especially compared to the unfiltered disturbance 602.

Figure 7A:
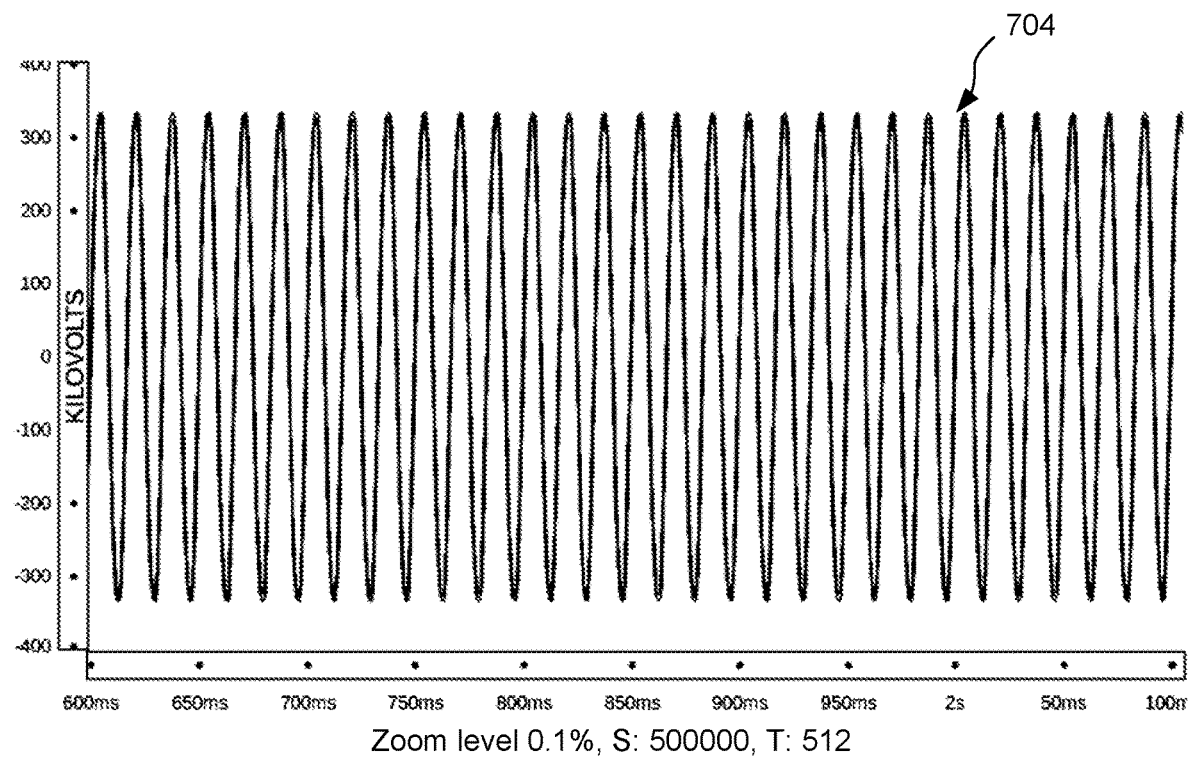
FIG. 7A illustrates a plot showing exemplary data with an unfiltered 60 Hz fundamental signal at zoom level 0.1%, S value of 500000, and T value of 512, in accordance with one embodiment.

FIG. 7A illustrates a plot 704 showing exemplary data with unfiltered 60 Hz fundamental signal at zoom level 0.1%, S value of 500000, and T value of 512, in accordance with one embodiment. As an option, the plot 704 may be implemented in the context of any one or more of the embodiments set forth in any previous and/or subsequent figure(s) and/or description thereof. However, it is to be appreciated that the plot 704 may be implemented in the context of any desired environment.

As shown in plot 700, at zoom level 0.1%, a disturbance 702 may be observed. In contrast to plot 600 which only slightly showed a disturbance in comparison to plot 604, the disturbance 702 on plot 700 is more readily or easily observed in comparison to plot 704.

Figure 7B:
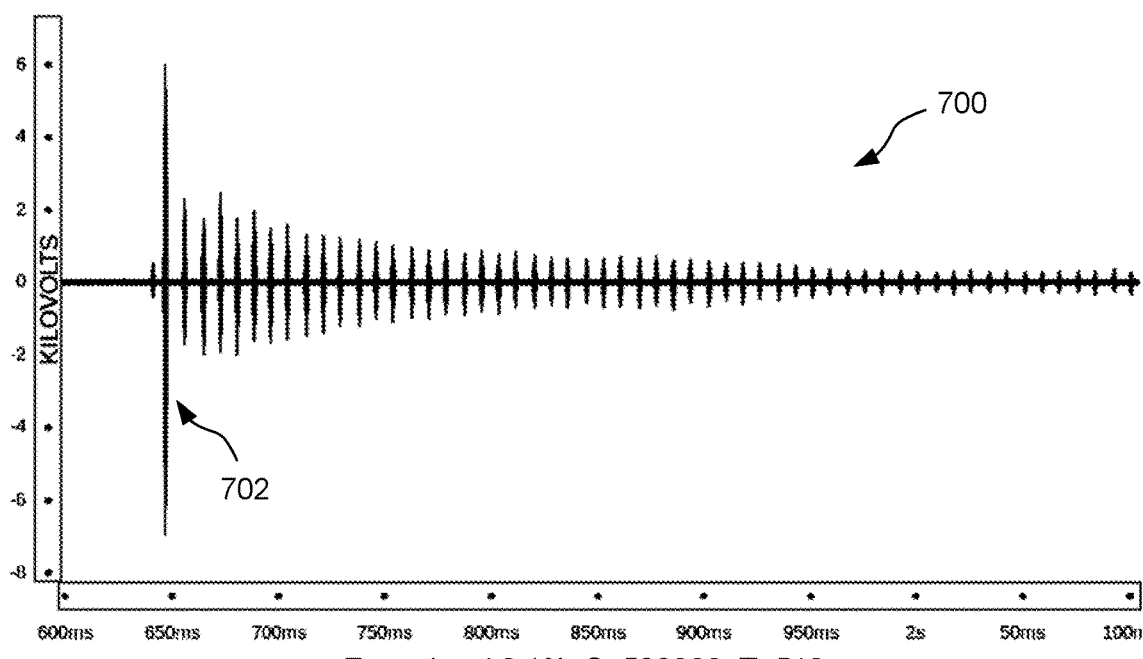
FIG. 7B illustrates a plot showing exemplary data with a high-pass filtered 60 Hz fundamental signal at zoom level 0.1%, S value of 500000, and T value of 512, in accordance with one embodiment.

FIG. 7B illustrates a plot 700 showing exemplary data with a high-pass filtered 60 Hz fundamental signal at zoom level 0.1%, S value of 500000, and T value of 512, in accordance with one embodiment. As an option, the plot 700 may be implemented in the context of any one or more of the embodiments set forth in any previous and/or subsequent figure(s) and/or description thereof. However, it is to be appreciated that the plot 700 may be implemented in the context of any desired environment.

Similar to plot 704, plot 700 is shown at zoom level 0.1% but, in comparison to plot 700 which showed a high-pass filtered signal, plot 704 shows an unfiltered signal. However, whereas plot 700 showed clearly a disturbance 702, no disturbance is readily observed in plot 704. Additionally, due to the large low frequency signal in plot 704, it is not possible to visually identify the disturbance. However, application of a high pass filter may remove the low frequency signal, and the remaining high-frequency signal may include a visible disturbance, as emphasized in plot 700. To this end, application of a high pass filter to the unfiltered signal (as shown in FIG. 7A) may cause low frequency data to be removed (while allowing high-frequency data to remain), resulting in high-frequency signals containing a visible disturbance (as shown in FIG. 7B).

Figure 8A:
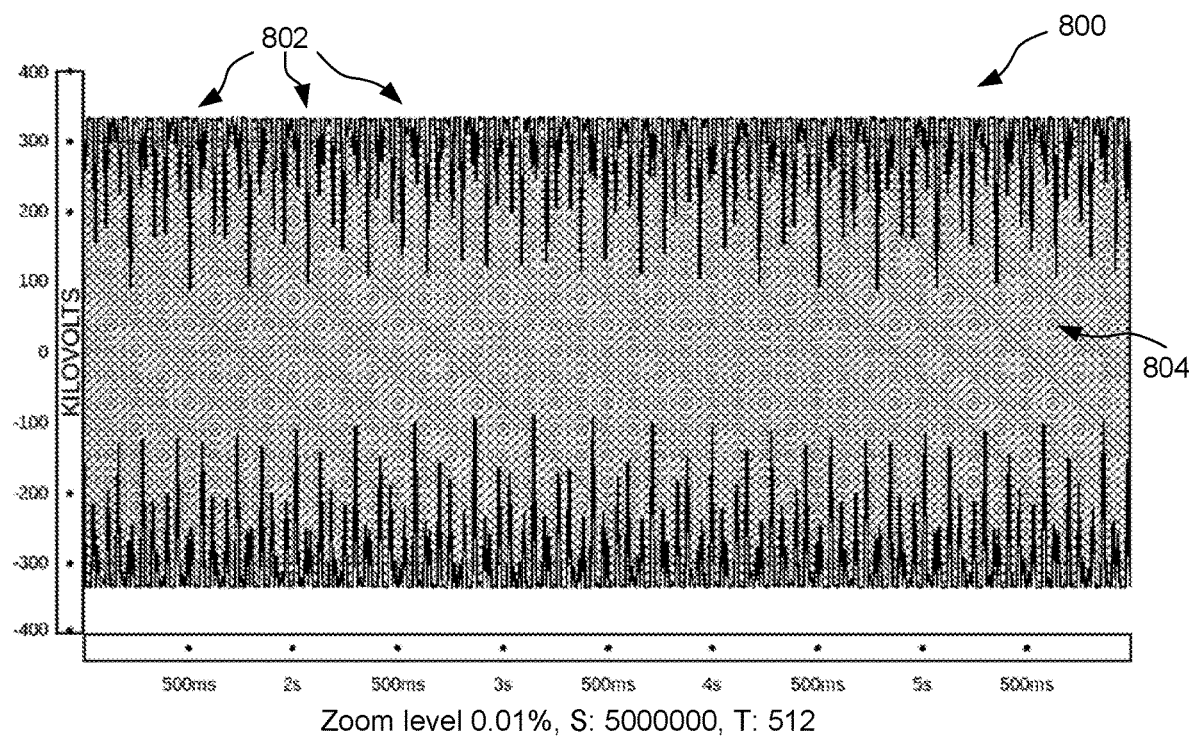
FIG. 8A illustrates a plot showing exemplary data with an unfiltered 60 Hz fundamental signal at zoom level 0.01%, S value of 5000000, and T value of 512, in accordance with one embodiment.

FIG. 8A illustrates a plot showing exemplary data with an unfiltered 60 Hz fundamental signal at zoom level 0.01%, S value of 5000000, and T value of 512, in accordance with one embodiment. As an option, the plot 800 may be implemented in the context of any one or more of the embodiments set forth in any previous and/or subsequent figure(s) and/or description thereof. However, it is to be appreciated that the plot 800 may be implemented in the context of any desired environment.

As shown in plot 800, at zoom level 0.01%, many disturbances 802 may be observed. Here, the shading 804 between the maximum value and the minimum value may also be readily observed. Additionally, plot 800 shows that the disturbance is so great, it may affect the overall voltage magnitude. In view of such, at extreme zoom levels (e.g. such as 0.01%) the representation of the maximum value and the minimum value may be used as a magnitude estimate. For example, min max downsampling may allow to downsample at a rate that is higher than an underlying fundamental frequency. Further, if a fundamental wave is 60 Hz and the sample acquisition rate is 10 kHz, then approximately 167 samples per 60 Hz waveform may result. If the min max downsample rate is wider than the fundamental frequency sampling period (e.g. 167 samples), then each waveform may be represented by a single min and single max which may be the max and min samples peaks of the waveform. Such representation may be an approximation of a peak of the waveform. In one embodiment, the representation may be further interpolated to a higher sampling rate in order to determine a more precise peak and trough.

Figure 8B:
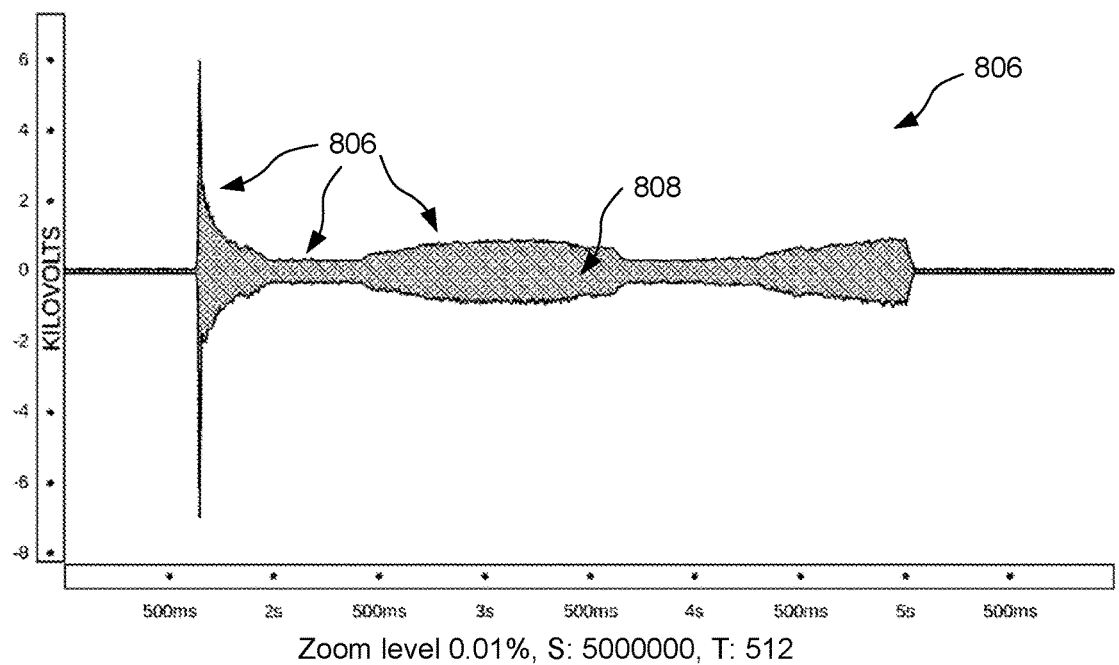
FIG. 8B illustrates a plot showing exemplary data with a high-pass filtered 60 Hz fundamental signal at zoom level 0.01%, S value of 5000000, and T value of 512, in accordance with one embodiment.

FIG. 8B illustrates a plot 806 showing exemplary data with a high-pass filtered 60 Hz fundamental signal at zoom level 0.01%, S value of 5000000, and T value of 512, in accordance with one embodiment. As an option, the plot 806 may be implemented in the context of any one or more of the embodiments set forth in any previous and/or subsequent figure(s) and/or description thereof. However, it is to be appreciated that the plot 806 may be implemented in the context of any desired environment.

Similar to plot 800, plot 806 is shown at zoom level 0.01% but, in comparison to plot 800 which showed an unfiltered signal, plot 806 shows a high-pass filtered signal. Similar to plot 800, plot 806 shows multiple disturbances 806 which may be readily and easily observed. Further, the shading 808 between the maximum value and the minimum value may also be readily observed. At such an extreme zoom level of 0.01% and with an S value of 5000000 and a T value of 512, nearly 9766 bins would result (i.e. T bins of S/T width). Such a plot emphasizes the need for using maximum values and minimum values, else the processor would be increasingly consumed in trying to display all raw data points. Rather than display all raw data points, however, through applying the method described herein, the processor can focus on displaying just the maximum value and the minimum value, thereby effectively reducing processor load and demands.

Figure 9:
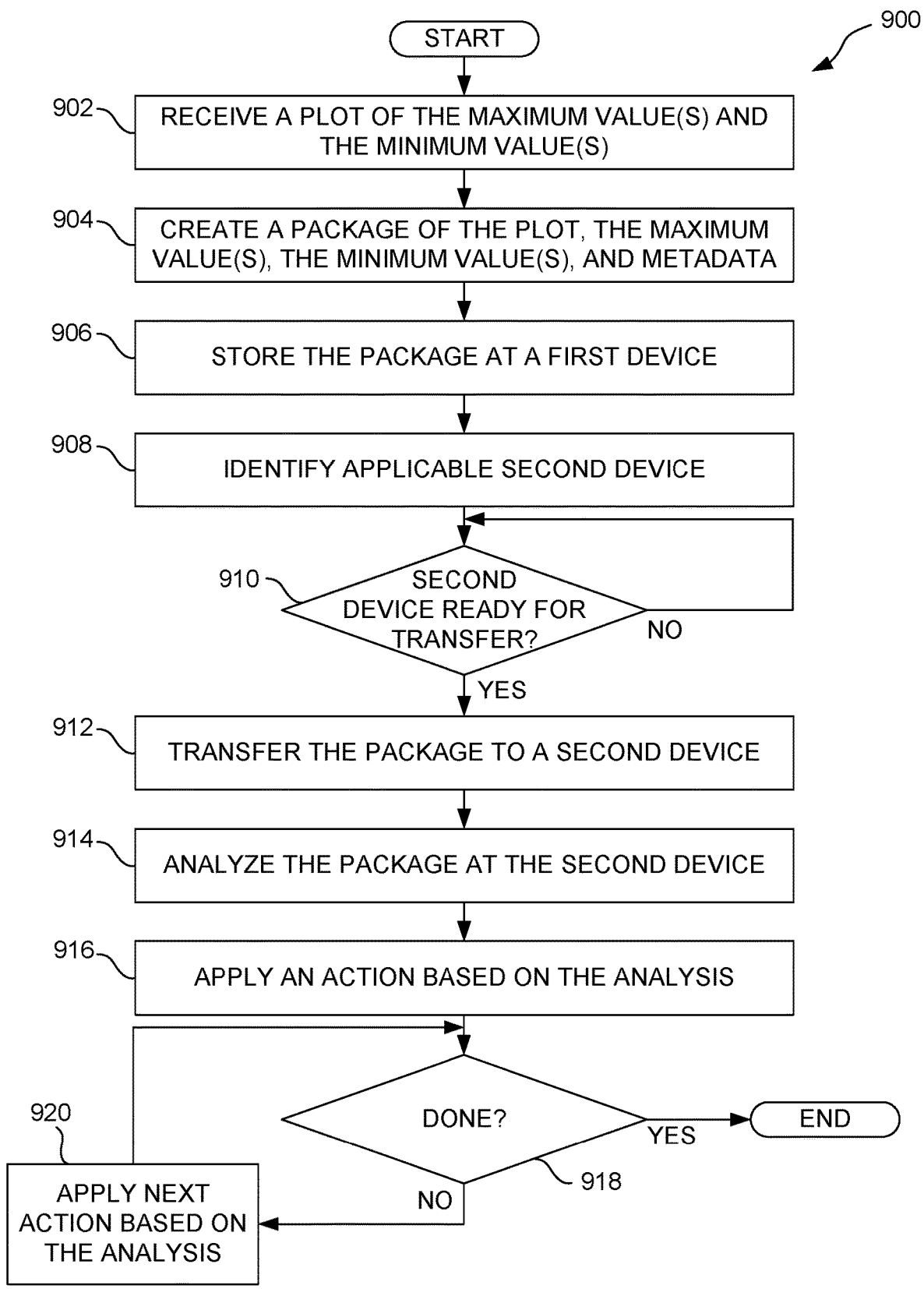
FIG. 9 illustrates a method for transferring information for generating a representation of high-frequency signal data, in accordance with one embodiment.

FIG. 9 illustrates a method 900 for transferring information for generating a representation of high-frequency signal data, in accordance with one embodiment. As an option, the method 900 may be implemented in the context of any one or more of the embodiments set forth in any previous and/or subsequent figure(s) and/or description thereof. Of course, however, the method 900 may be implemented in the context of any desired environment. Further, the aforementioned definitions may equally apply to the description below.

As shown, per operation 902, a plot of the maximum value(s) and the minimum value(s) is received. In various embodiments, the plot may be received by an IED, a device connected to an IED, a database, a server, and/or any device capable of receiving the plot and/or input data. Next, per operation 904, in one embodiment, a package is created of the plot, the maximum value(s), the minimum value(s), and accompanying metadata. In another embodiment, a package may not be created and the plot of the maximum value(s) and the minimum value(s) may be directly stored on a first device and then transferred to a second device. In the context of the present description, the metadata may include any information associated with the plot, the input data, the maximum value(s), or the minimum value(s). For example, in one embodiment, the metadata may include a date and time of the plot, a location (e.g. sensor device, etc.) from which the signal data originated, etc.

Additionally, per operation 906, the package is stored at a first device. The first device may be an IED, a device connected to an IED (e.g. mass storage 284), a database, a server, and/or any device capable of saving the package. In one embodiment, the first device may store the package for a set time period, or after transferring the package to a second device (per operation 912), the first device may delete such package from the first device.

Next, per operation 908, an applicable second device is identified. For example, a downstream device (from the first device), a managing device, or a device associated with a technician and/or administrator, may be identified as being applicable to the data contained within the package. Additionally, a sample of high-frequency signal data may include a maximum value and a minimum value corresponding with a detected signal anomaly. A first IED that captured such signal data may identify accompanying metadata such as a data, time, location, sensor identification, magnitude of the error (e.g. priority of error ranking, etc.), etc. The first IED (or any device receiving the input data), based on the metadata captured, may determine that the error should be escalated to a managing technician and send the package to such managing technician for review. In this manner, the first IED receives the sample of signal data, creates a downsampled package (e.g. to decrease data amount, etc.), identifies where the package should be sent, and sends the package to the appropriate destination.

Moreover, per decision 910, it is determined whether the second device is ready for transfer. In one instance, the second device may be ready immediately. In other instances, the second device may be offline for at time period or otherwise temporarily unavailable. Still yet, if the first device communicates with the second device via an intermediary device (e.g. server, relay station, etc.), the first device may relay the package to the intermediary device to be forwarded on to the second device when it is available. If the second device is not ready for transfer, then the method loops back to decision 910. Once the second device is available, then per operation 912, the package is transferred to the second device.

Additionally, the package may be analyzed at the second device per operation 914. For example, the package may be scanned for one or more error flags, a detected anomaly(ies), etc. Based on the analysis, per operation 916, an action is applied. Such action may include notifying a user (e.g. technician, etc.), saving the plot as an image (e.g. TIFF, etc.), compiling the package as a formal report to be sent to one or more individuals, causing an effect (e.g. close, start, shut-down, verify data, reset, etc.) to occur on a power system component (e.g. sensor, generator, etc.), etc. In one embodiment, if analyzing the package does not identify any needed actions, the package may be configured to be presented to a user (e.g. technician) for review. For example, the plot may be displayed with the maximized value and the minimized value for presentation to an end user, wherein the end user may manipulate the plot (e.g. zooming in and out) to more effectively analyze any potential discrepancies. In such manner, the package may be manually reviewed for accuracy.

Next, it is determined per decision 918 whether all actions are done. If not, then per operation 920, the next action is applied based on the analysis (see operation 914). Once all actions have been completed, then the method ends. In this manner, all actions identified by the second device may be implemented.

In one embodiment, the representation of high-frequency signal data may include generating a thumbnail of the plot, a preconfigured size (e.g. 1024×512 pixels) image of the plot, etc. Such a thumbnail or preconfigured size image may be sent downstream to a subsequent device for processing. For example, if the minimum value and maximum value (as displayed on the plot) were received by a second device, such second device may analyze the contents, which may in turn trigger an action to analyze the data further, send the package on to another device, etc. In one embodiment, the second device may choose to ignore the package (i.e. no high priority disturbances were detected or did not surpass a preconfigured threshold, etc.).

In another embodiment, the package sent to a second device (or any subsequent device) may include compressed data (e.g. the plot, the minimum value(s), the maximum value(s)). The subsequent device may first analyze the metadata (which may not be compressed) to determine if the compressed package warrants to be uncompressed and further analyzed. If the metadata, for example, indicates that the disturbance is of minimal system impact, the system may rank the package low, until a low-point time is found (where no other higher ranking packages need an action to be taken) when such package can be uncompressed and analyzed. In another embodiment, if the package ranks below a predetermined ranking threshold, the system may proceed to discard the package and not take any further action.

Figure 10A:
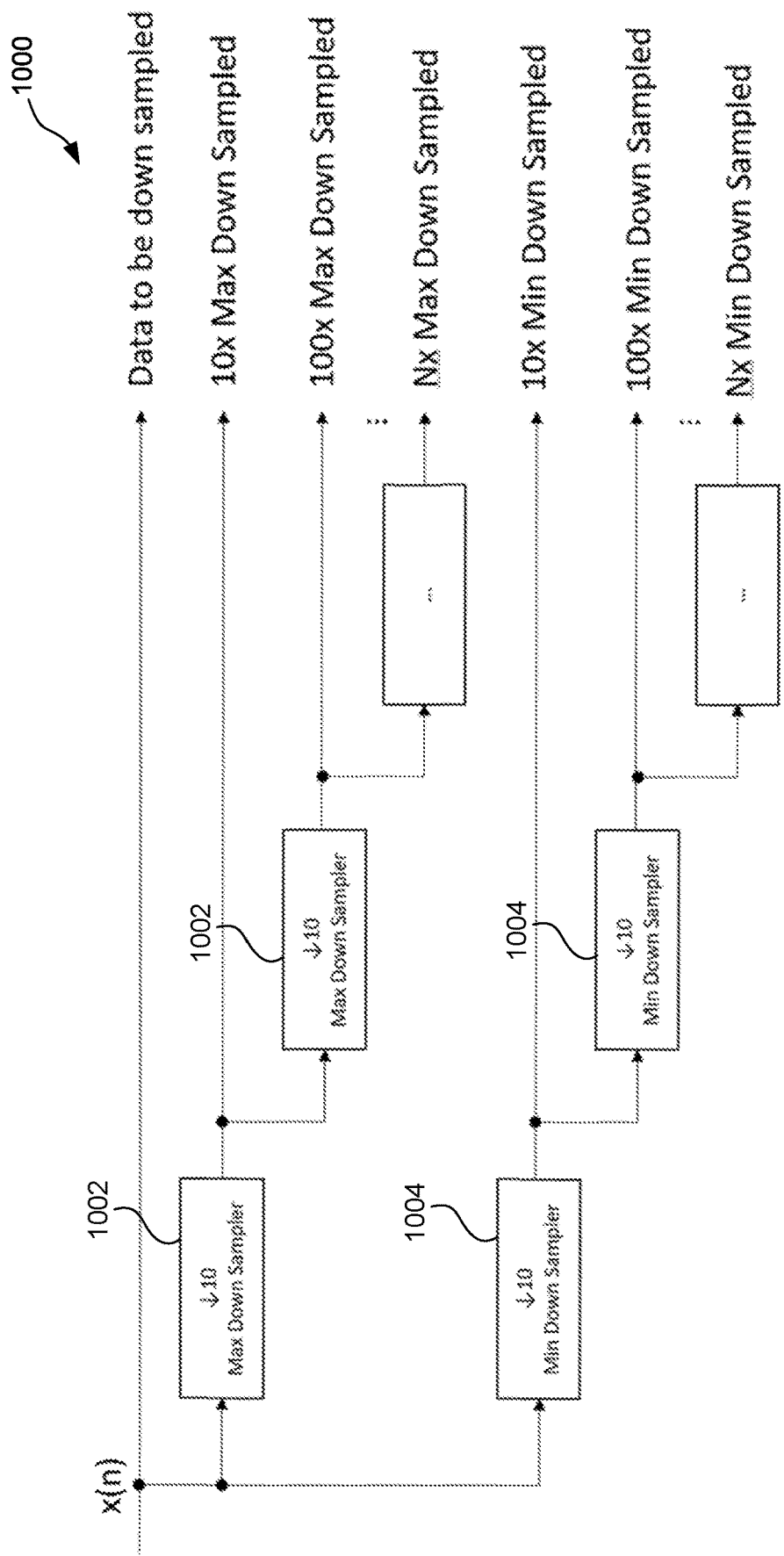
FIG. 10A illustrates a process for identifying min and max downsampled values, in accordance with one embodiment.

FIG. 10A illustrates a process 1000 for identifying min and max downsampled values, in accordance with one embodiment. As an option, the process 1000 may be implemented in the context of any one or more of the embodiments set forth in any previous and/or subsequent figure(s) and/or description thereof. However, it is to be appreciated that the process 1000 may be implemented in the context of any desired environment.

As shown, process 1000 includes input data (represented as "x(n)") which can then be subsequently max downsampled 1002 or min downsampled 1004. Each max downsampling and each min downsampling can then be each iteratively downsampled further to N iterations. As an example, a first max downsampling of 10× may result in a max downsampling of 10×. A subsequent max downsampling of an additional 10× may result in a max downsampling of 100×, and so forth to N iterations. In like manner, a first min downsampling of 10× may result in a min downsampling of 10×. A subsequent min downsampling of an additional 10× may result in a min downsampling of 100×, and so forth to N iterations. In one embodiment, a pre-identification of a pre-maximum value and a pre-minimum value may be identified for use in calculating a max/min downsampled value (through applying the process 1000).

In one embodiment, given a bin of N samples, a minimum value sample and a maximum value sample may represent a min and max for such bin. Additionally, a determination of a minimum value sample and maximum value sample may be performed for each bin range. For example, in one embodiment, process 1000 may be used to satisfy operation 312 where, for each bin, the maximum value x_max[k] and the minimum value x_min[k] may be identified and/or calculated. Further, when using one or more min and max outputs to cascade into further min and max downsampling (as shown in process 1000), an initial minimum value (or intermediately determined minimum value) may be used as a basis for the ultimately determined minimum value, and an initial maximum value (or intermediately determined maximum value) may be used as a basis for the ultimately determined maximum value.

Further, each layer of processed data (e.g. original data, 10× Max downsampled data, 100× Max downsampled data, etc.) may be stored in a database (e.g. local, remote, etc.). To this end, the stored data may allow rapid display of both zoomed-out data (including pre-computation of zoomed out views). In this manner, recording signal data at a variety of zoom levels may allow to quickly display associated minimum and maximum waveforms at any arbitrary zoom level (e.g. from full original data to any time (years), etc.).

Figure 10B:
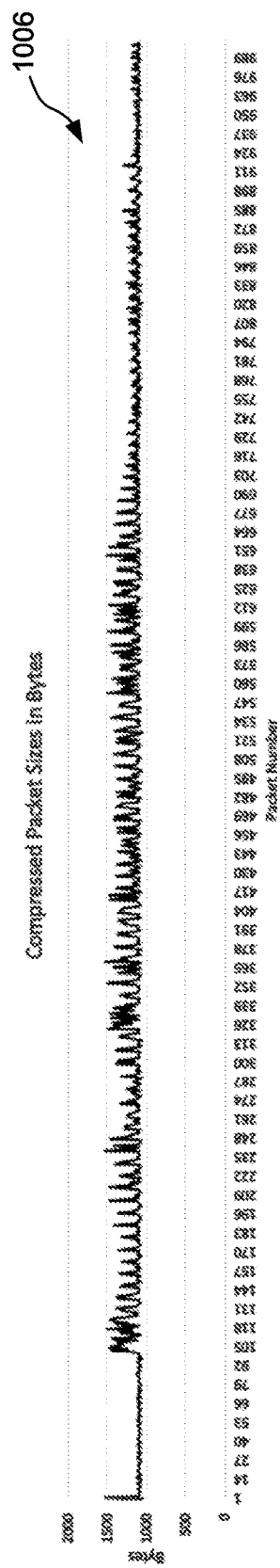
FIG. 10B illustrates a plot applying the process of FIG. 10A, in accordance with one embodiment.

FIG. 10B illustrates a plot 1006 applying the process 1000, in accordance with one embodiment. As an option, the plot 1006 may be implemented in the context of any one or more of the embodiments set forth in any previous and/or subsequent figure(s) and/or description thereof. However, it is to be appreciated that the plot 1006 may be implemented in the context of any desired environment.

As shown, plot 1006 shows an exemplary plot of a signal, where compressed packet sizes are shown in bytes per packet number.

Figure 10C:
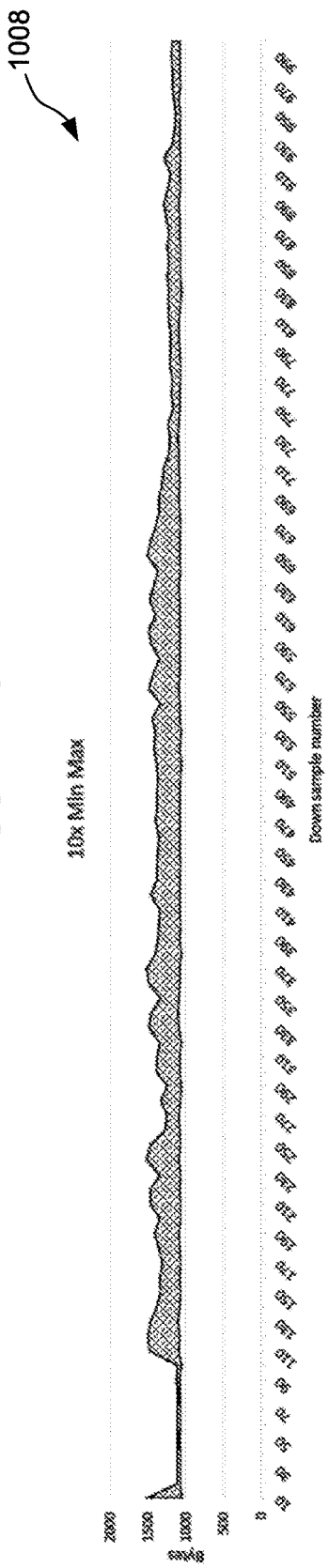
FIG. 10C illustrates a plot which is a 10× downsampling of the plot shown in FIG. 10B, in accordance with one embodiment.

FIG. 10C illustrates a plot 1008 which is a 10× downsampling of plot 1006, in accordance with one embodiment. As an option, the plot 1008 may be implemented in the context of any one or more of the embodiments set forth in any previous and/or subsequent figure(s) and/or description thereof. However, it is to be appreciated that the plot 1008 may be implemented in the context of any desired environment.

As shown, plot 1008 is a 10× min downsampling and a 10× max downsampling of plot 1006.

Figure 10D:
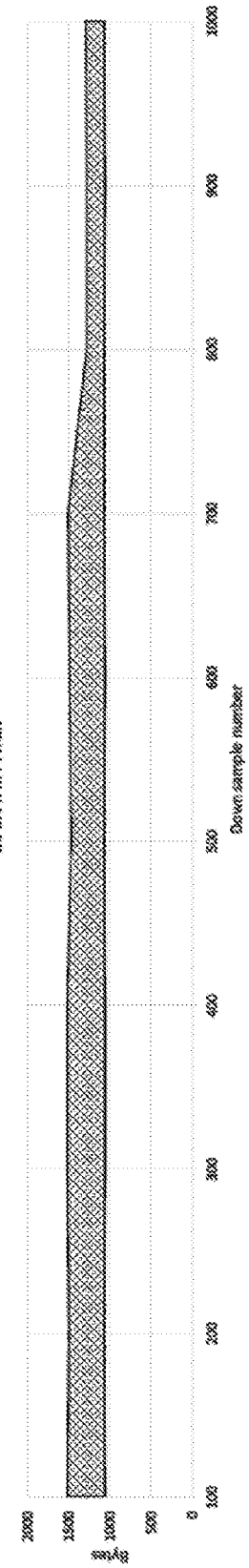
FIG. 10D illustrates a plot which is a 100× downsampling of the plot shown in FIG. 10B, in accordance with one embodiment.

FIG. 10D illustrates a plot 1010 which is a 100× downsampling of plot 1006, in accordance with one embodiment. As an option, the plot 1010 may be implemented in the context of any one or more of the embodiments set forth in any previous and/or subsequent figure(s) and/or description thereof. However, it is to be appreciated that the plot 1010 may be implemented in the context of any desired environment.

As shown, plot 1010 is a 100× min downsampling and a 100× max downsampling of plot 1006.

Figure 10E:
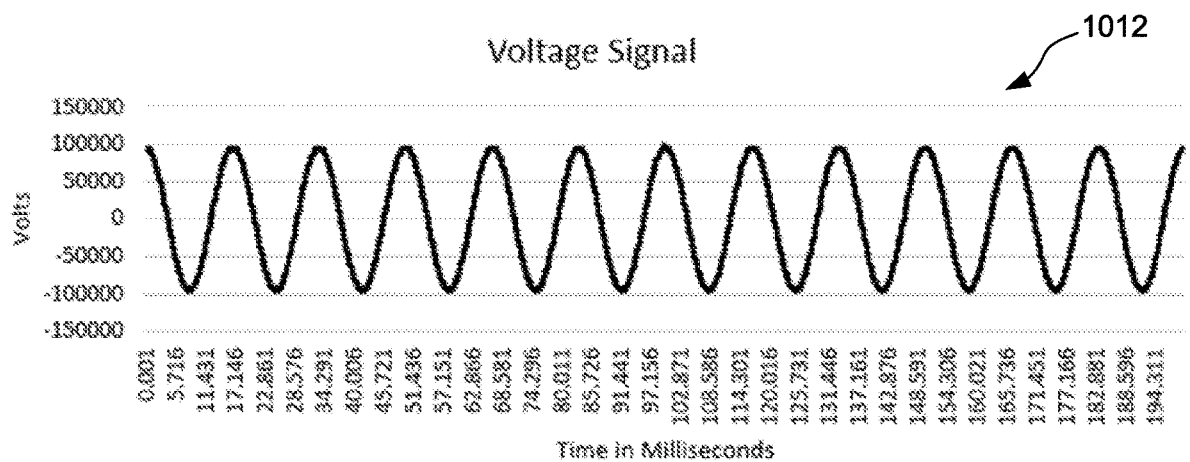
FIG. 10E illustrates a plot of a voltage signal, in accordance with one embodiment.

FIG. 10E illustrates a plot 1012 of a voltage signal, in accordance with one embodiment. As an option, the plot 1012 may be implemented in the context of any one or more of the embodiments set forth in any previous and/or subsequent figure(s) and/or description thereof. However, it is to be appreciated that the plot 1012 may be implemented in the context of any desired environment.

As shown, a raw voltage signal corresponds with plot 1012. As will be shown hereinafter (e.g. in FIGS. 10F-10J), plot 1012 may be downsampled in stages. Additionally, FIG. 10K is a high pass filtered version of plot 1012. In one embodiment, min max downsampling may be applied to signals after other filtering (e.g. including any filtering needed to represent the signal in such a way as to facilitate analysis of specific aspects of that signal) has occurred. For example, a high pass filter may be applied to the original signal in order to remove low frequency information that may not be of interest when performing high-frequency analysis.

Figure 10F:
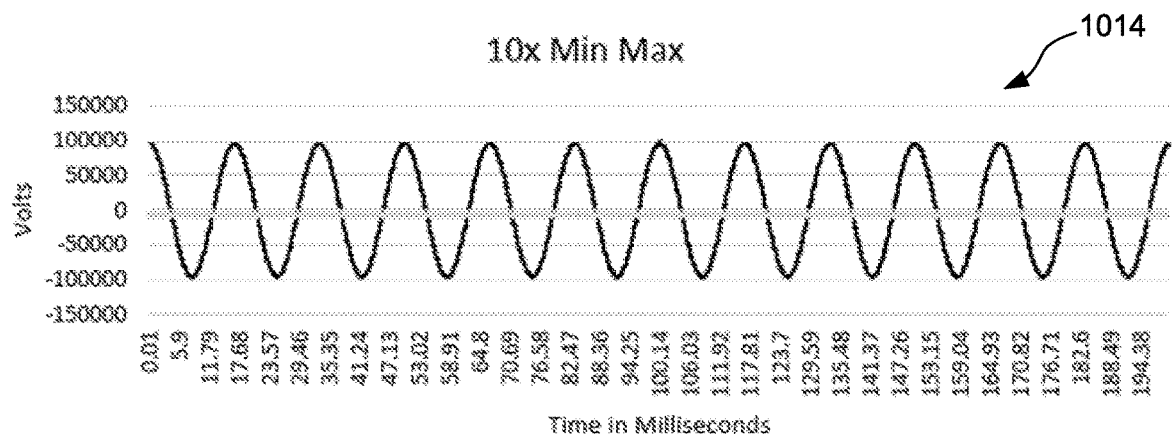
FIG. 10F illustrates a plot of a 10× min max downsampled signal of the plot shown in FIG. 10E, in accordance with one embodiment.

FIG. 10F illustrates a plot 1014 of a 10× min max downsampled signal of plot 1012, in accordance with one embodiment. As an option, the plot 1014 may be implemented in the context of any one or more of the embodiments set forth in any previous and/or subsequent figure(s) and/or description thereof. However, it is to be appreciated that the plot 1014 may be implemented in the context of any desired environment.

As shown, plot 1014 is a 10× min downsampling and a 10× max downsampling of plot 1012.

Figure 10G:
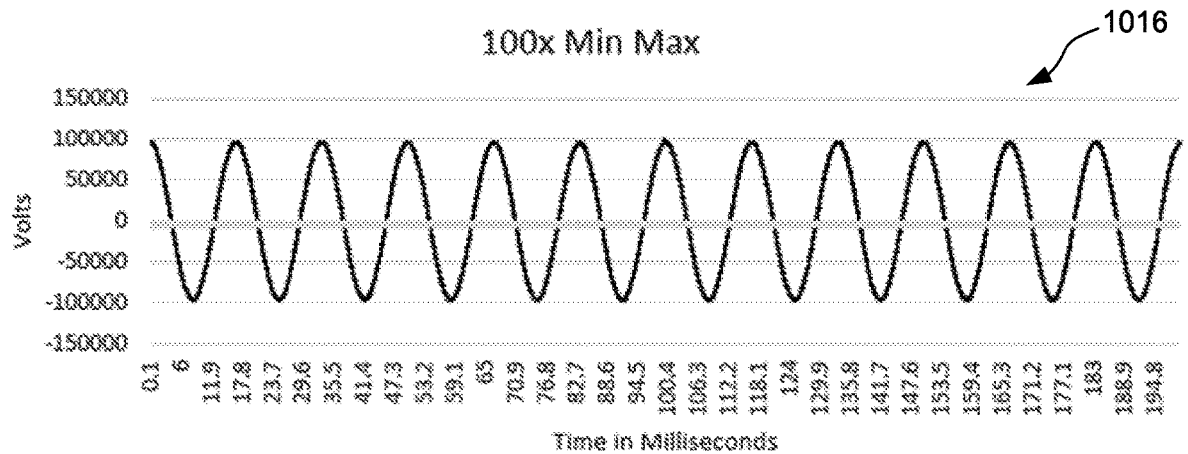
FIG. 10G illustrates a plot of a 100× min max downsampled signal of the plot shown in FIG. 10E, in accordance with one embodiment.

FIG. 10G illustrates a plot 1016 of a 100× min max downsampled signal of plot 1012, in accordance with one embodiment. As an option, the plot 1016 may be implemented in the context of any one or more of the embodiments set forth in any previous and/or subsequent figure(s) and/or description thereof. However, it is to be appreciated that the plot 1016 may be implemented in the context of any desired environment.

As shown, plot 1016 is a 100× min downsampling and a 100× max downsampling of plot 1012.

Figure 10H:
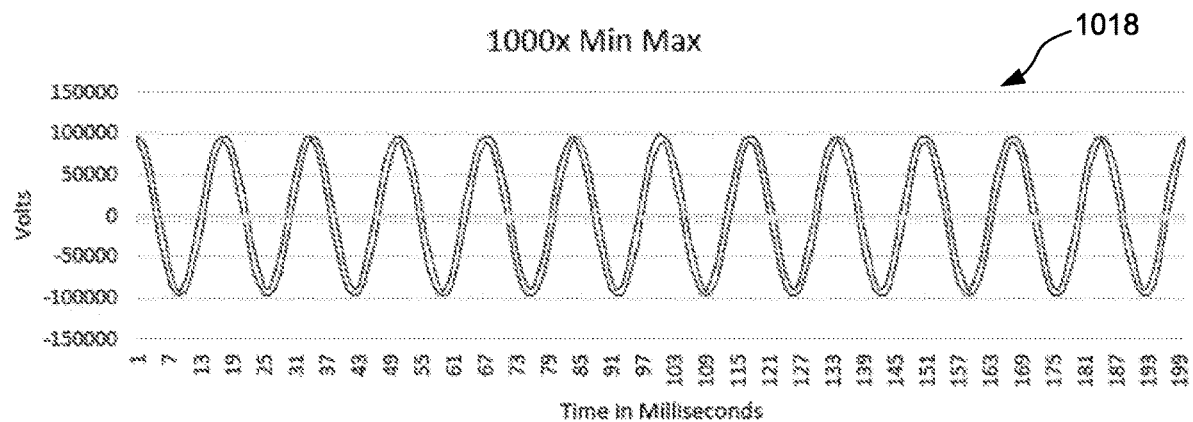
FIG. 10H illustrates a plot of a 1000× min max downsampled signal of the plot shown in FIG. 10E, in accordance with one embodiment.

FIG. 10H illustrates a plot 1018 of a 1000× min max downsampled signal of plot 1012, in accordance with one embodiment. As an option, the plot 1018 may be implemented in the context of any one or more of the embodiments set forth in any previous and/or subsequent figure(s) and/or description thereof. However, it is to be appreciated that the plot 1018 may be implemented in the context of any desired environment.

As shown, plot 1018 is a 1000× min downsampling and a 1000× max downsampling of plot 1012.

Figure 10I:
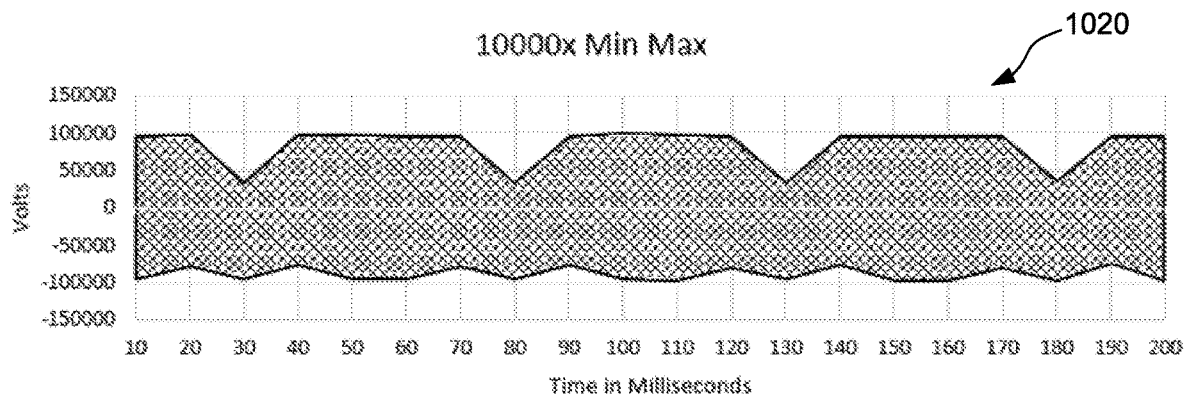
FIG. 10I illustrates a plot of a 10000× min max downsampled signal of the plot shown in FIG. 10E, in accordance with one embodiment.

FIG. 10I illustrates a plot 1020 of a 10000× min max downsampled signal of plot 1012, in accordance with one embodiment. As an option, the plot 1020 may be implemented in the context of any one or more of the embodiments set forth in any previous and/or subsequent figure(s) and/or description thereof. However, it is to be appreciated that the plot 1020 may be implemented in the context of any desired environment.

As shown, plot 1020 is a 10000× min downsampling and a 10000× max downsampling of plot 1012.

Figure 10J:
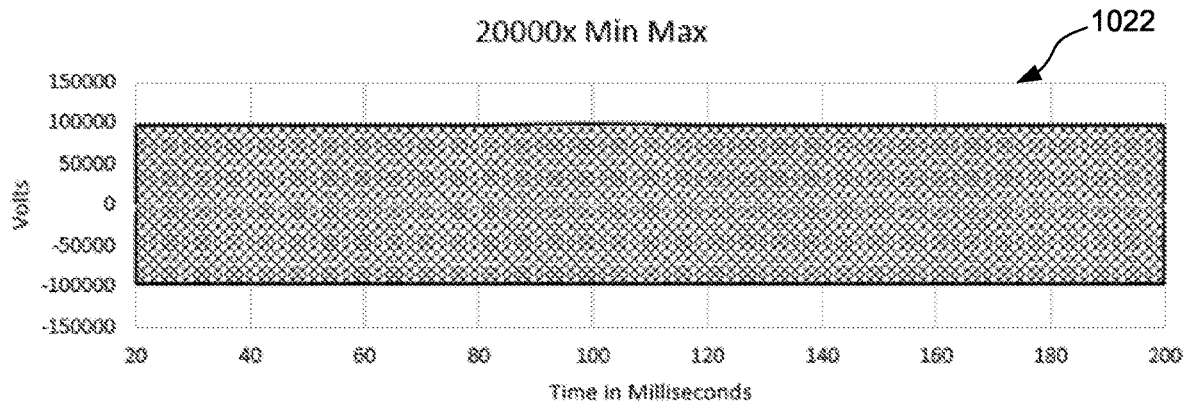
FIG. 10J illustrates a plot of a 20000× min max downsampled signal of the plot shown in FIG. 10E, in accordance with one embodiment.
Figure 10K:
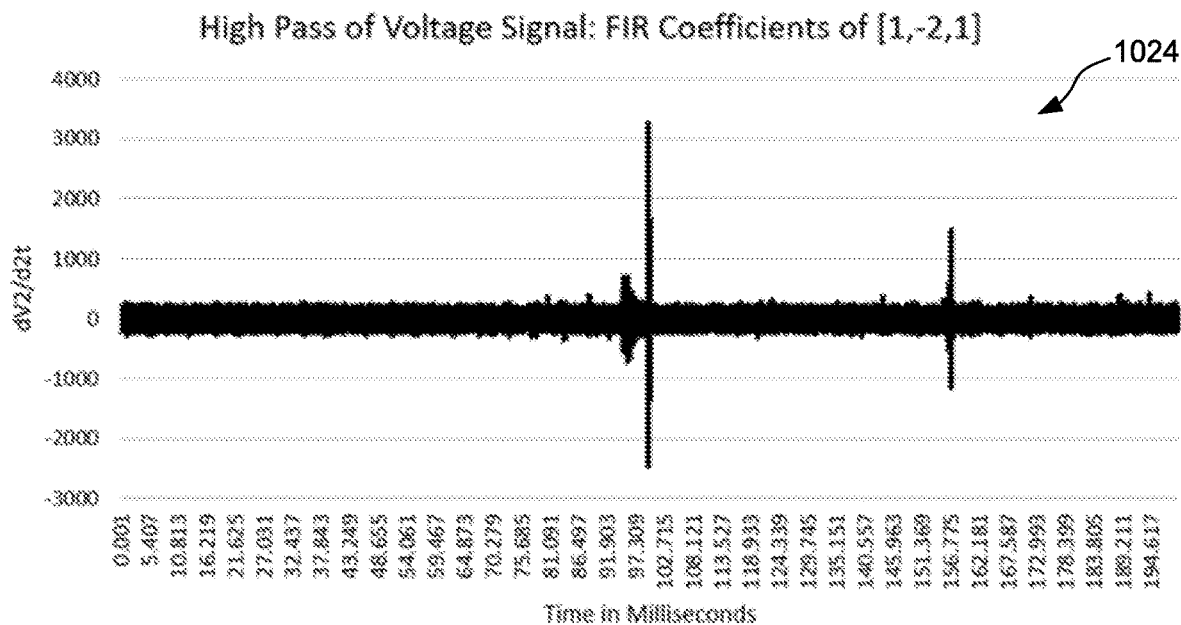
FIG. 10K illustrates a plot of a high pass filter applied to a voltage signal, in accordance with one embodiment.

FIG. 10J illustrates a plot 1022 of a 20000× min max downsampled signal of plot 1012, in accordance with one embodiment. As an option, the plot 1022 may be implemented in the context of any one or more of the embodiments set forth in any previous and/or subsequent figure(s) and/or description thereof. However, it is to be appreciated that the plot 1022 may be implemented in the context of any desired environment.

As shown, plot 1022 is a 20000× min downsampling and a 20000× max downsampling of plot 1012.

FIG. 10K illustrates a plot 1024 of a high pass filter applied to a voltage signal, in accordance with one embodiment. As an option, the plot 1024 may be implemented in the context of any one or more of the embodiments set forth in any previous and/or subsequent figure(s) and/or description thereof. However, it is to be appreciated that the plot 1024 may be implemented in the context of any desired environment.

As shown, plot 1024 shows a modification of plot 1012 where a high pass filter has been applied. In one embodiment, min max filtering (as shown, e.g., in plot 1024) may allow for analysis of a voltage signal with respect to absolute peaks of the waveforms over time when zoomed out sufficiently (which may depend on the original acquisition sample rate). For example, if sampling at 1 MHz and where a fundamental frequency is between 50 and 70 Hz, then the voltage signal may be downsampled by a factor of 20000× to ensure at least one waveform per downsample window. If it were desired to investigate the voltage signal at a lesser downsampling amount, a root mean square ("RMS") transform may be applied to the original voltage signal. Of course, it is noted that other forms of filtering and transformations may be applied to min max downsampling. The examples therefore presented herewith are not intended to be limiting in any manner.

Figure 10L:
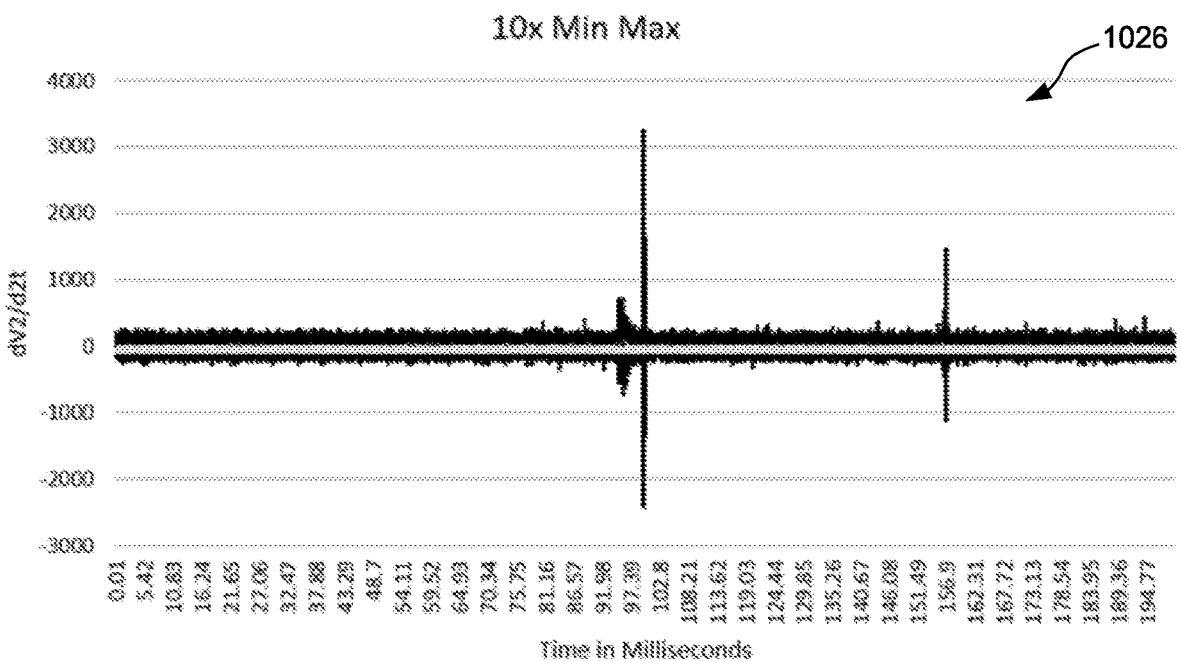
FIG. 10L illustrates a plot of a 10× min max downsampled signal of the plot shown in FIG. 10K, in accordance with one embodiment.

FIG. 10L illustrates a plot 1026 of a 10× min max downsampled signal of plot 1024, in accordance with one embodiment. As an option, the plot 1026 may be implemented in the context of any one or more of the embodiments set forth in any previous and/or subsequent figure(s) and/or description thereof. However, it is to be appreciated that the plot 1026 may be implemented in the context of any desired environment.

As shown, plot 1026 is a 10× min downsampling and a 10× max downsampling of plot 1024.

Figure 10M:
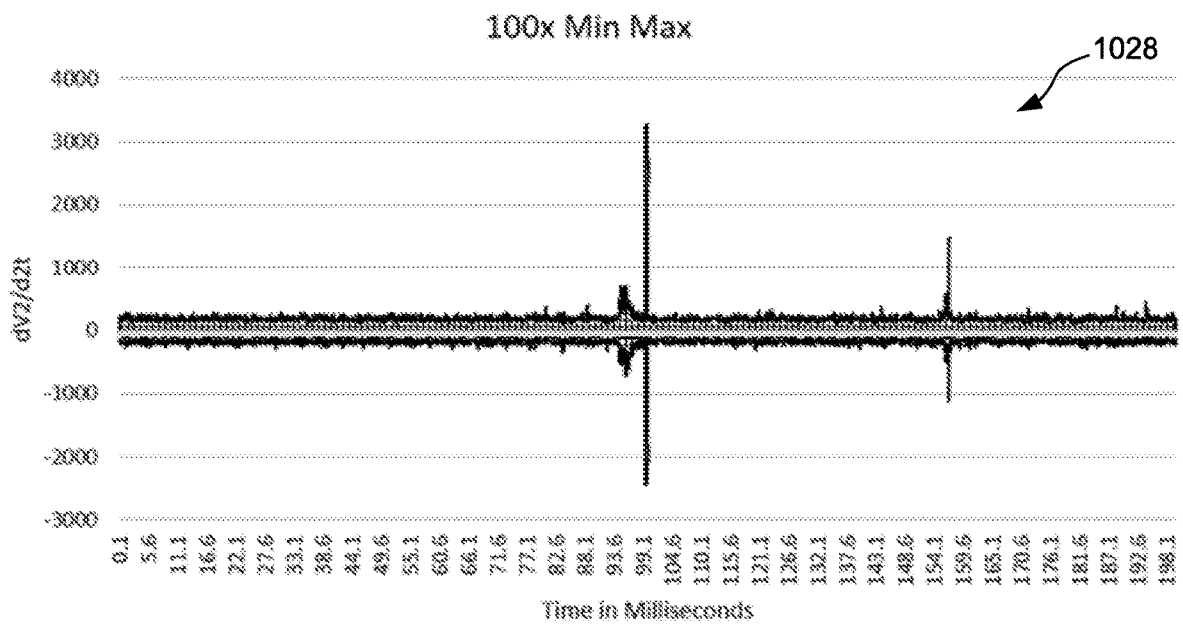
FIG. 10M illustrates a plot of a 100× min max downsampled signal of the plot shown in FIG. 10K, in accordance with one embodiment.

FIG. 10M illustrates a plot 1028 of a 100× min max downsampled signal of plot 1024, in accordance with one embodiment. As an option, the plot 1028 may be implemented in the context of any one or more of the embodiments set forth in any previous and/or subsequent figure(s) and/or description thereof. However, it is to be appreciated that the plot 1028 may be implemented in the context of any desired environment.

As shown, plot 1028 is a 100× min downsampling and a 100× max downsampling of plot 1024.

Figure 10N:
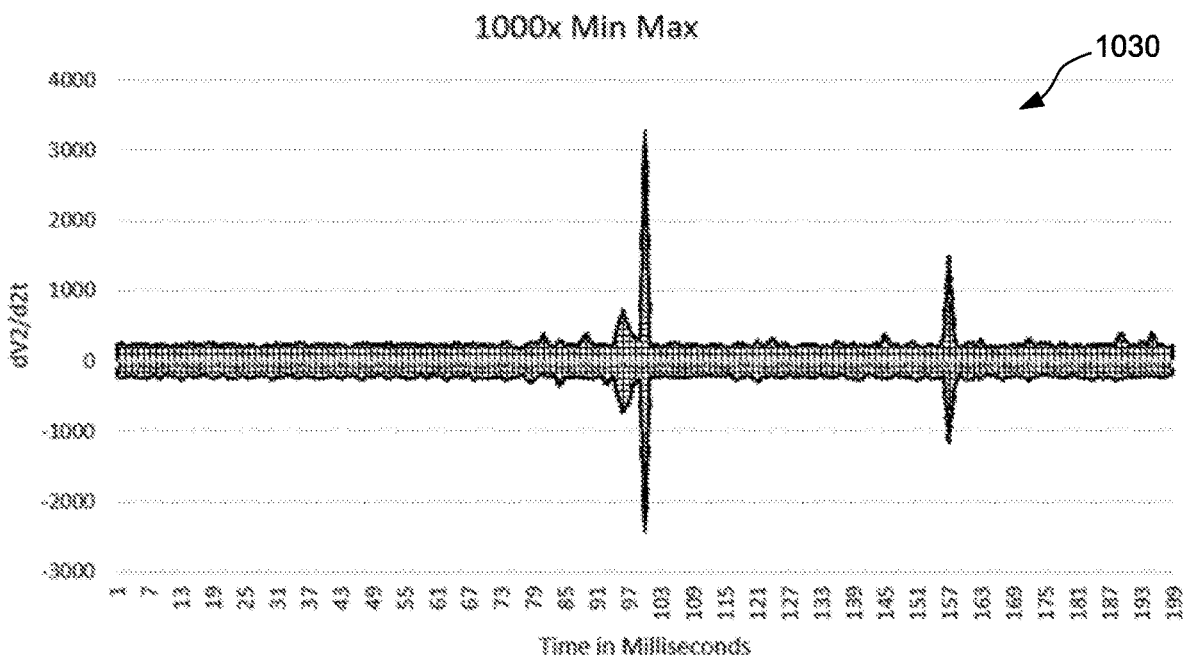
FIG. 10N illustrates a plot of a 1000× min max downsampled signal of the plot shown in FIG. 10K, in accordance with one embodiment.

FIG. 10N illustrates a plot 1030 of a 1000× min max downsampled signal of plot 1024, in accordance with one embodiment. As an option, the plot 1030 may be implemented in the context of any one or more of the embodiments set forth in any previous and/or subsequent figure(s) and/or description thereof. However, it is to be appreciated that the plot 1030 may be implemented in the context of any desired environment.

As shown, plot 1030 is a 1000× min downsampling and a 1000× max downsampling of plot 1024. Additionally, plot 1030 shows a min and max value at each time value with a shading (e.g. shown as crisscross lines, etc.) in between each of the min and max values. In other embodiments, display of the min and max values may include at least one of: 1) two signal waveforms, one at a minimum and one at a maximum; 2) two signal waveforms displayed in bold, with shading between (as presently shown in plot 1030); and 3) shading between and including the minimum and maximum values, without bolding the signals at the actual minimum and maximum.

In various embodiments, min max downsampling may occur in stages and may be applied to a raw voltage signal. Further, a high pass filter may be applied to a raw voltage signal for further processing. Additionally, high pass filtering followed by min max downsampling may allow for investigation of very large amounts of data for excursions beyond known thresholds.

Figure 11:
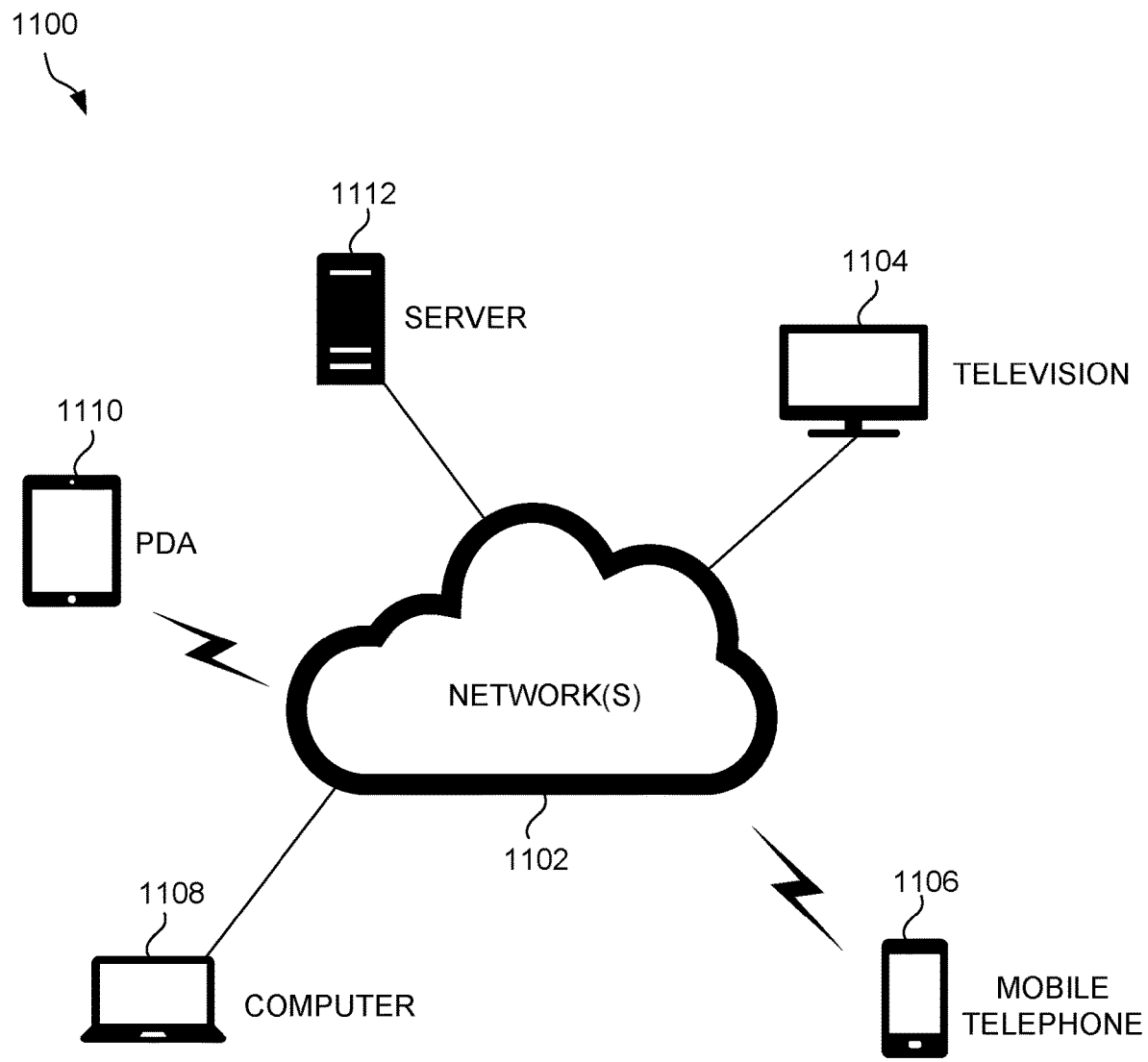
FIG. 11 illustrates a network architecture, in accordance with one possible embodiment.

FIG. 11 illustrates a network architecture 1100, in accordance with one possible embodiment. As shown, at least one network 1102 is provided. In the context of the present network architecture 1100, the network 1102 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 1102 may be provided.

Coupled to the network 1102 is a plurality of devices. For example, a server computer 1112 and an end user computer 1108 may be coupled to the network 1102 for communication purposes. Such end user computer 1108 may include a desktop computer, lap-top computer, and/or any other type of logic. Still yet, various other devices may be coupled to the network 1102 including a personal digital assistant (PDA) device 1110, a mobile phone device 1106, a television 1104, etc.

Figure 12:
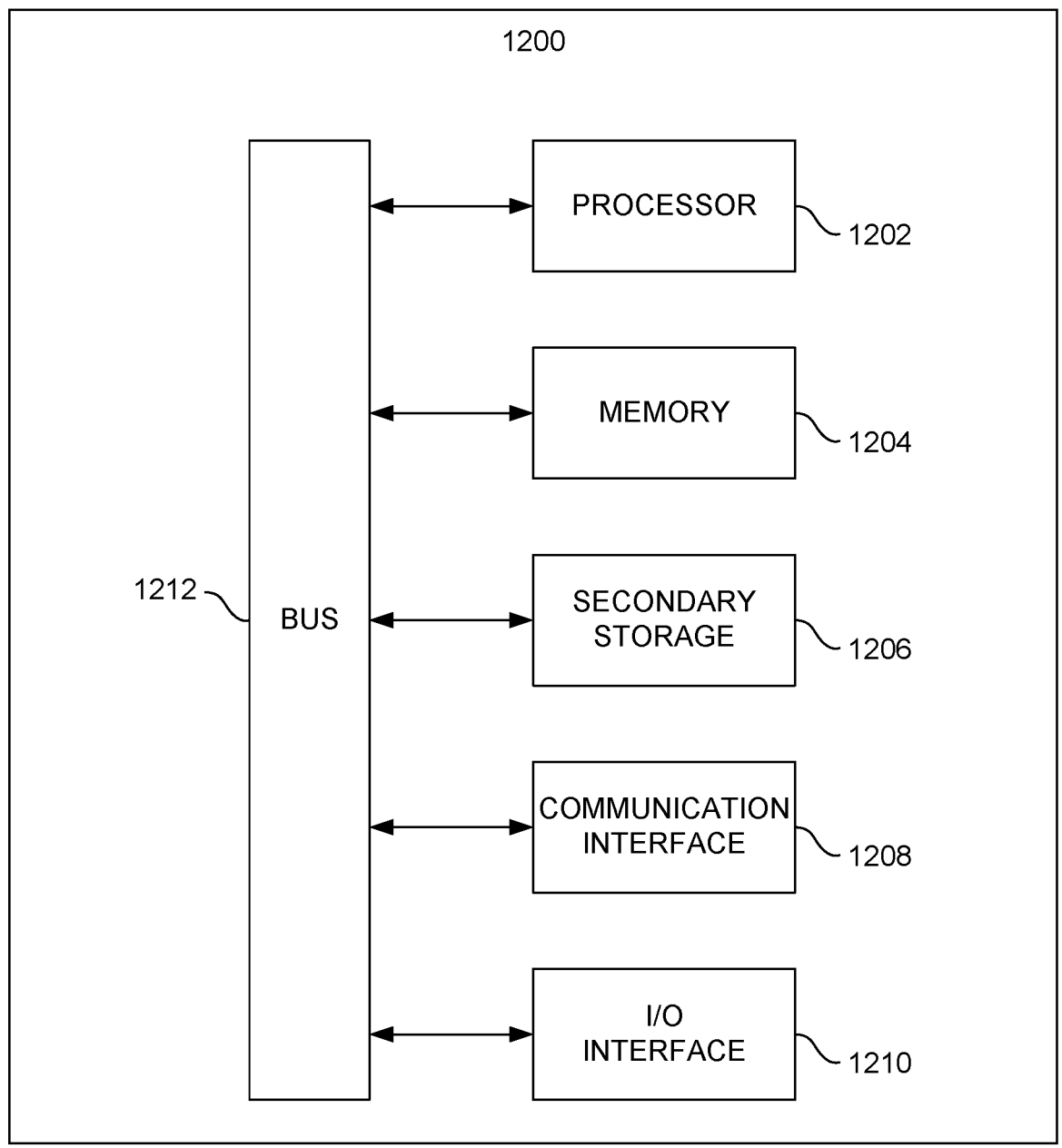
FIG. 12 illustrates an exemplary system, in accordance with one embodiment.

FIG. 12 illustrates an exemplary system 1200, in accordance with one embodiment. As an option, the system 1200 may be implemented in the context of any of the devices of the network architecture 1100 of FIG. 11. Of course, the system 1200 may be implemented in any desired environment.

As shown, a system 1200 is provided including at least one central processor 1202 which is connected to a bus 1212. The system 1200 also includes memory 1204 [e.g. random access memory (RAM), etc.]. The system 1200 also includes a communication interface 1208 and an I/O interface 1210.

The system 1200 may also include a secondary storage 1206. The secondary storage 1206 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 1204, the secondary storage 1206, and/or any other memory, for that matter. Such computer programs, when executed, enable the system 1200 to perform various functions (as set forth above, for example). Memory 1204, storage 1206 and/or any other storage are possible examples of non-transitory computer-readable media.

It has been observed that under certain conditions, a power system signal may exhibit attributes wherein the minimum and maximum values for each time bin (or segment) are simply the first and last values in each time bin. In such conditions, the Min and Max values as described above (normal Min Max) may not be as useful for the display as described. For example, when representing signals that contain a dominant frequency (e.g. voltage or current), and where those signals are oversampled with respect to the dominant frequency (e.g. 1 kHz or higher when dealing with an electric power system operating at nominally 50 Hz or 60 Hz), use of the above-described Min Max downsampling would result in normal Min Max outputs where the Min and Max represent the difference between the first and last samples of the bin at the incoming frequency rather than the underlying signal itself. What is needed is a system and methods to better represent the underlying signal itself, even when the signals contain a dominant frequency, and the signals are oversampled with respect to the dominant frequency.

Disclosed herein are systems and methods for improving the representation of the underlying signals, even when the signals contain a dominant frequency, and the signals are oversampled with respect to the dominant frequency. The methods and systems disclosed herein may incorporate an underlying trend of the underlying signal to determine new Min and Max values. As such, a better approximation of the signal may be obtained, while still representing areas where the frequency content is hidden by the output signal.

Figure 13B:
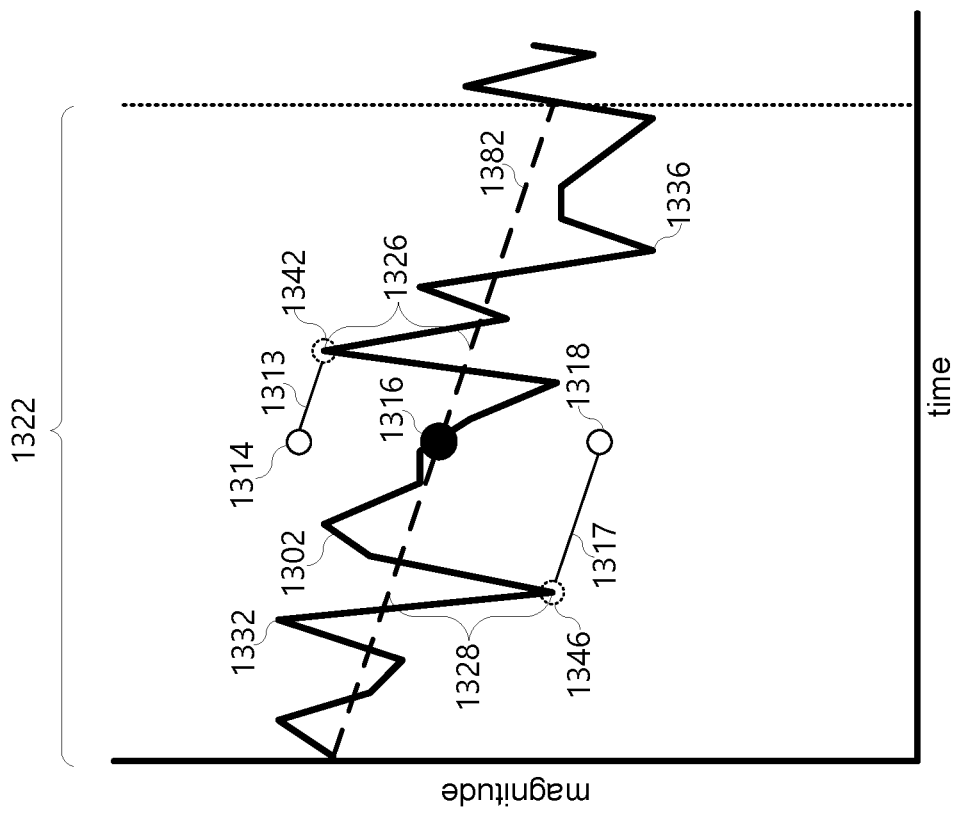
FIGS. 13A and 13B illustrate plots of a power system signal over time with min max values (FIG. 13A) and interpolated min max values (FIG. 13B).
Figure 13A:
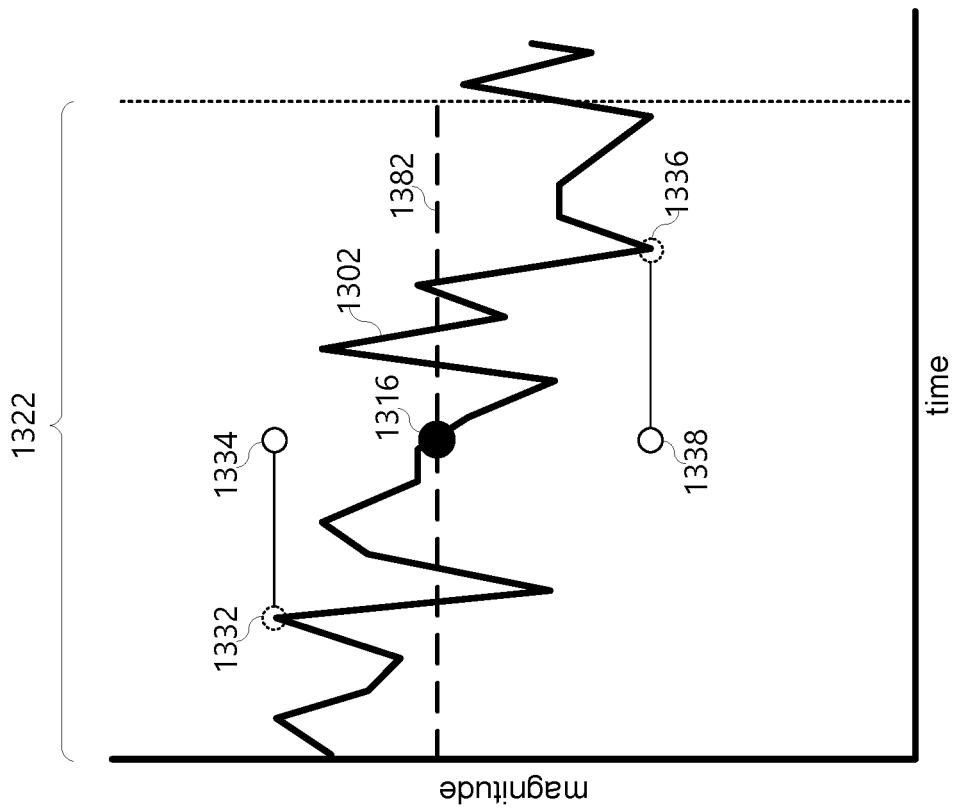

FIG. 13A illustrates a plot of a magnitude of an electric power system signal 1302 over time, including minimum and maximum values (normal Min Max) of the electric power system signal magnitude in accordance with several embodiments described above. Within bin 1322, the signal includes a local maximum 1332 and a local minimum 1336. For ease of comparison, also illustrated is center point 1316 at the horizontal (time) center of the bin 1322 corresponding with the magnitude of the signal 1302 at that point. Horizontal line 1382 illustrates the magnitude of the signal 1302 at that mid-point time 1316 in bin 1322. Further, the magnitude of the maximum 1332 is illustrated at 1344 in line with the time center 1316; and the magnitude of the minimum 1336 is illustrated at 1338 in line with the time center 1316. The vertical area between the maximum 1332 and minimum 1338 for time bin 1332 would cover the entire signal 1302. Accordingly, the normal Min and Max as described in several embodiments above may be used to represent the range of values within a time bin.

In an improvement to the above embodiments, trend minimum and maximum values may be used instead of the minimum and maximum values as described above. This allows for better use and visualization of an electric power system signal, especially when the signal contains a dominant frequency and the signal is sampled at a rate greater than Nyquist with respect to the frequency. To illustrate the improvement, FIG. 13B illustrates the time bin 1322 and electrical signal 1302 of FIG. 13A. Trendline 1382 of the electrical signal 1302 is illustrated. It should be noted that the trendline 1382 correlates with a trend of the electrical signal 1302 over the time of bin 1322. A trend maximum and a trend minimum are determined using the trendline. In accordance with a first embodiment, the trend maximum and trend minimum are found by first determining a signal maximum 1342 as the point on the signal that is the largest positive deviation 1326 from (furthest above) the trendline 1382; and a signal minimum 1346 as the point on the signal that is the largest negative deviation 1328 from (furthest below) the trendline 1382. In accordance with one embodiment, these signal deviations from the trendline are used as the trend minimum 1346 and trend maximum 1342 values.

In accordance with another embodiment, also illustrated in FIG. 13B, the trend minimum and trend maximum values are determined by shifting the minimum 1346 and maximum 1342 points along a slope equal to the slope of the trendline 1382 to the bin time-center, in line with point 1316. As illustrated, the trend signal minimum 1346 which is the largest negative deviation from the trendline 1382 may be shifted along line 1317, which has a slope equal to the slope of the trendline 1382, to be in line with the center time 1316, to form trend minimum 1318. Similarly, the trend signal maximum 1342 may be shifted along line 1313, which has a slope equal to the slope of the trendline 1382, to be in line with the center time 1316, to form trend maximum 1314. In accordance with one embodiment, these shifted signal deviations from the trendline are used as the trend minimum 1318 and trend maximum 1314 values.

The trendline 1382 may be computed for each time bin 1322. In other embodiments, the trendline 1382 may be computed across multiple time bins, or even between time bins. In one embodiment, the trendline is computed as a liner interpolation between a mean point of a previous bin and a mean point of a current bin. In another embodiment, the trendline may be computed as a continuous interpolation filter where the nth previous average and the current average provide the linear interpolation points. A group delay adjustment may be provided. In another embodiment, the trendline may be computed using polynomial or nth order linear interpolation. The trendline may be computed using other curve fitting methods.

The trend minimum and maximum may be used in place of the normal Min Max values in any of the above-described embodiments. Use of the trend minimum and maximum values may improve the previous embodiments, especially where the trend of the overall frequency of the electric signal is more prominent than deviations within particular time bins. FIG. 14A illustrates a plot of an electric power system signal 1402 over time bins 1422, 1424, 1426, and 1428. Minimum and maximum values in accordance with the previous embodiments are illustrated. For example, the maximum 1404 and the minimum 1412 of bin 1428 are illustrated in comparison with the mean point 1416. It should be noted that the maximum 1404 of bin 1428 is the minimum point 1404 of bin 1426; the maximum of bin 1426 is the minimum of bin 1424; and the maximum of bin 1424 is the minimum of bin 1422. Similarly, the first sample of each bin 1422-1428 is the maximum value of each bin; and the last sample in each bin 1422-1428 is the minimum value of each bin. Clearly, the overall trend of the signal is more prominent than any internal deviations from a mean within each bin. Accordingly, use and visualization of the maximum and minimum values of each bin in accordance with the previous methods is not as useful for use or visualization of the input data as it is for visualizing and using the overall trend.

FIG. 14B similarly illustrates the input signal 1402 over time bins 1422-1428. Instead of the previous Min Max values for minimum and maximum in each bin, the illustrated embodiment shows trend minimum and trend maximum values. The trend minimum and maximum may be simple deviations from the trendline such as points 1454 (trend maximum) and 1472 (trend minimum). In other embodiments, the trend minimum and maximum may be shifted along the trendline to be align with the center point 1476 such as trend maximum 1456 and trend minimum 1474. In both instances, the trend minimum and trend maximum are improvements over the previous embodiments for using and visualizing input data when the overall trend of the data is more prominent than internal deviations from a mean within each bin.

The trend maximum values and trend minimum values may be used in place of the maximum values and minimum values in the above embodiments. For example, the identified maximum value and identified minimum values as described in conjunction with steps 312-314 of FIG. 3 may be the trend maximum and trend minimum values. Furthermore, the trend maximum values and trend minimum values may be used as the maximum and minimum values in the method described in FIG. 9.

It is noted, however, that for input signals where the linear trend is less prominent than deviations from a mean within each bin, the previously-described Min Max values may be useful. That is, as the ratio between the output sampling rate and the Nyquist rate of the dominant frequency increases, each three-point group of output points more closely resembles a linear trend. When the linear trend is prominent, the trend minimum and trend maximum values may be more useful. When the linear trend is less prominent (the dominant frequency bleeds through into the output signal), the normal Min Max values may be more useful, as is clearly seen in FIGS. 13A, 13B, 14A and 14B.

In several embodiments, therefore, the systems and methods described herein may determine whether to use the normal Min Max values or the currently-described trend minimum and trend maximum values. This determination may include a comparison of an output rate and a dominant frequency of the input signal. The output rate may be a number of samples of data to display per cycle of the dominant frequency. The number of samples may be determined by the data length and may include downsampling as described above. As the number of samples of data to display per cycle of dominant frequency (also described as the output rate) increases, the linear trend becomes more prominent, making the trend minimum and trend maximum more useful. Similarly, as the number of samples of data to display per cycle of dominant frequency (also described as the output rate) decreases, the linear trend becomes less prominent, making the normal Min Max values more useful.

In certain embodiments, the prominence of the linear trend may be related to a factor, J, of the dominant frequency. For example, the linear trend may be related to Nyquist, where J is 2. When the output rate is less than (or not greater than) the factor of the dominant frequency, then the normal Min Max values may be used, because the linear trend is not prominent. However, when the output rate is greater than (or not less than) the factor of the dominant frequency, then the trend minimum and trend maximum may be used because the linear trend is prominent.

Figure 15:
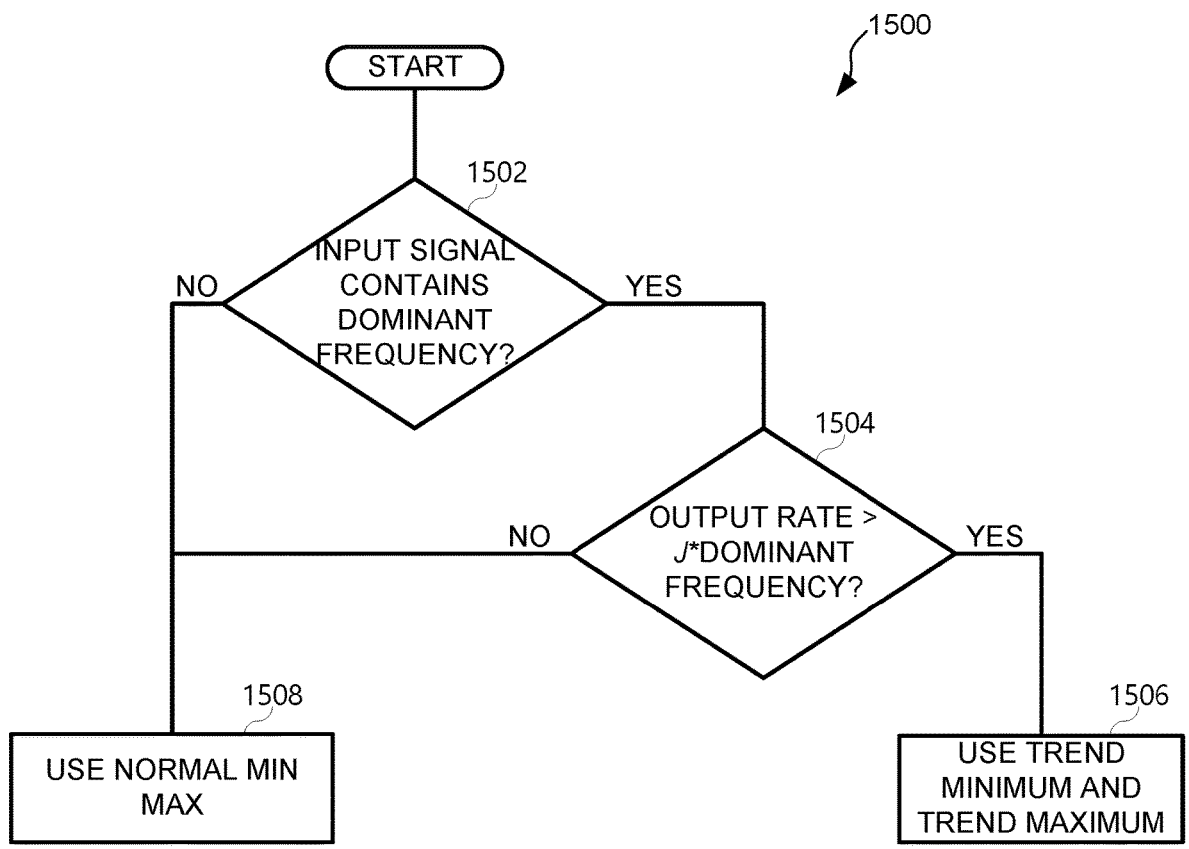
FIG. 15 illustrates a process for using min max or interpolated min max in accordance with several embodiments herein.

FIG. 15 illustrates a flow chart of a method 1500 for determining whether to use normal Min Max or trend minimum and trend maximum values. The method 1500 starts with determining whether the input signal contains a dominant frequency 1502. The dominant frequency may be determined using a past history of the input signal. The dominant frequency may be a setting indicating a nominal dominant frequency of the signal. For example, many AC electric power systems operate on 50 Hz or 60 Hz nominal. Voltage, current, and other signals from such power system could exhibit a dominant frequency at or near the nominal frequency. If the input signal does not include a dominant frequency in 1502, then the method uses normal Min Max values 1508 as described further above.

If the input signal does include a dominant frequency at 1502, then the method proceeds to determine whether the output rate is greater than a factor J of the dominant frequency 1504. If the output rate is not greater than the factor of the dominant frequency at 1504, then the method proceeds to use the normal Min Max values 1508. Otherwise, if the output rate is greater than the factor of the dominant frequency at 1504, then the method proceeds to use the trend minimum and trend maximum values 1506 as described herein.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the claimed subject matter.

The embodiments described herein included the one or more modes known to the inventor for carrying out the claimed subject matter. Of course, variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device, comprising:
   a non-transitory memory storing instructions; and
   one or more processors in communication with the non-transitory memory, wherein the one or more processors execute the instructions to:
   receive input data, wherein the input data is of a first width of input data samples over time;
   process the input data to manage display of the input data, including:
   dividing the input data into one or more segments;
   identifying a trend of the input data;
   identifying, from each segment of the one or more segments, a trend maximum value of the input data within the segment; and
   identifying, from each segment of the one or more segments, a trend minimum value of the input data within the segment;
   transform the input data to a visualizable representation of the input data, the visualizable representation of the input data including a plot of the trend maximum value and the trend minimum value for each segment of the one or more segments; and,
   display the plot.

2. The device of claim 1, wherein the trend maximum value comprises a value from the input data exhibiting a maximum positive deviation from the trend.

3. The device of claim 1, wherein the trend minimum value comprises a value from the input data exhibiting a minimum negative deviation from the trend.

4. The device of claim 1, wherein the trend comprises a slope.

5. The device of claim 4, wherein the trend maximum value comprises a value shifted from a maximum positive deviation of the input data from the trend along the slope of the trend to align with a center of the segment.

6. The device of claim 4, wherein the trend minimum value comprises a value shifted from a maximum negative deviation of the input data from the trend along the slope of the trend to align with a center of the segment.

7. The device of claim 1, wherein the trend comprises a linear interpolation between mean points of the input data in adjacent segments.

8. The device of claim 1, wherein the plot further includes a shaded region between the maximum value and the minimum value for each segment of the one or more segments.

9. The device of claim 8, wherein an overlay is displayed over the plot.

10. The device of claim 9, wherein the overlay includes one of a median value of each segment of the one or more segments or a filtered sampled value, the overlay being displayed in a different color than a color of the shaded region.

11. A method, comprising:
receiving, using a processor, input data including high-frequency signals, wherein the input data is of a first width;
processing, using the processor, the input data to manage display of the input data, including:
dividing the input data into one or more segments over time;
identifying a trend of the input data;
identifying, from each segment of the one or more segments, a trend maximum value of the input data within the segment; and
identifying, from each segment of the one or more segments, a trend minimum value of the input data within the segment;
transforming, using the processor, the input data to a visualizable representation of the high-frequency signals, the visualizable representation of the high-frequency signals including a plot of the trend maximum value and the trend minimum value for each segment of the one or more segments; and
displaying, using the processor, the plot.

12. A method, comprising:
receiving, using a processor, input data including high-frequency signals, wherein the input data is of a first width;
processing, using the processor, the input data to manage display of the input data, including:
dividing the input data into one or more segments over time;
determining an output rate of data from the input data for display;
determining whether the input data comprises a dominant frequency;
determining whether the output rate is less than a factor of the dominant frequency;
when the output rate is greater than the factor of the dominant frequency:
determining a maximum for each segment as a trend maximum; and
determining a minimum for each segment as a trend minimum;
when the output rate is not greater than the factor of the dominant frequency:
determining a maximum for each segment as a maximum input data value within each segment; and
determining a minimum for each segment as a minimum input data value within each segment;
transforming, using the processor, the input data to a visualizable representation of the high-frequency signals, the visualizable representation of the high-frequency signals including a plot of the maximum and the minimum for each segment of the one or more segments; and
displaying, using the processor, the plot.

13. The method of claim 12, wherein when the output rate is greater than the factor of the dominant frequency, the processing comprises identifying a trend of the input data.

14. The method of claim 13, wherein
the trend maximum comprises a value from the input data exhibiting a maximum positive deviation from the trend; and
the trend minimum comprises a value from the input data exhibiting a maximum negative deviation from the trend.

15. The method of claim 13, wherein the trend comprises a slope.

16. The method of claim 15, wherein the trend maximum comprises a value shifted from a maximum positive deviation of the input data from the trend along the slope of the trend to align with a center of the segment.

17. The method of claim 15, wherein the trend minimum comprises a value shifted from a maximum negative deviation of the input data from the trend along the slope of the trend to align with a center of the segment.

18. The method of claim 15, wherein the trend comprises a linear interpolation between mean points of the input data in adjacent segments.

* * * * *